United States Patent
Mazzochette

(10) Patent No.: US 8,129,734 B2
(45) Date of Patent: Mar. 6, 2012

(54) LED PACKAGE WITH STEPPED APERTURE

(75) Inventor: Joseph B. Mazzochette, Cherry Hill, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 639 days.

(21) Appl. No.: 12/135,042

(22) Filed: Jun. 6, 2008

(65) Prior Publication Data

US 2008/0296599 A1 Dec. 4, 2008

Related U.S. Application Data

(62) Division of application No. 11/475,292, filed on Jun. 27, 2006, now abandoned.

(60) Provisional application No. 60/694,788, filed on Jun. 27, 2005, provisional application No. 60/738,478, filed on Nov. 21, 2005, provisional application No. 60/763,828, filed on Jan. 31, 2006.

(51) Int. Cl.
*H01L 33/00* (2010.01)

(52) U.S. Cl. .......... 257/98; 156/512; 362/236; 362/294

(58) Field of Classification Search .................. 362/236, 362/294; 156/512; 257/98
See application file for complete search history.

(56) References Cited

U.S. PATENT DOCUMENTS

| | | |
|---|---|---|
| 4,803,546 A | 2/1989 | Sugimoto et al. |
| 5,172,301 A | 12/1992 | Schneider |
| 5,195,154 A | 3/1993 | Uchida et al. |
| 5,202,288 A | 4/1993 | Doering et al. |
| 5,216,283 A | 6/1993 | Lin |
| 5,307,519 A | 4/1994 | Mehta et al. |
| 5,457,605 A | 10/1995 | Wagner et al. |
| 5,468,910 A | 11/1995 | Knapp et al. |
| 5,471,327 A | 11/1995 | Tedesco et al. |

(Continued)

FOREIGN PATENT DOCUMENTS

JP 57-226326 7/1984

(Continued)

OTHER PUBLICATIONS

PCT Search Report; International Application No. PCT/US2006/024928; International Filing Date: Jun. 27, 2006; Date of Mailing Jan. 31, 2008.

(Continued)

*Primary Examiner* — Kenneth Parker
*Assistant Examiner* — Dale E Page
(74) *Attorney, Agent, or Firm* — Cantor Colburn LLP

(57) ABSTRACT

A light emitting diode (LED) package for high temperature operation which includes a printed wire board and a heat sink. The LED package may include a formed heat sink layer, which may be thermally coupled to an external heat sink. The printed wire board may include apertures that correspond to the heat sink such that the heat sink is integrated with the printed wire board layer. The LED package may include castellations for mounting the package on a secondary component such as a printed wire board. The LED package may further comprise an isolator disposed between a base metal layer and one or more LED die. Optionally, the LED die may be mounted directly on a base metal layer. The LED package may include a PWB assembly having a stepped cavity, in which one or more LED die are disposed. The LED package is advantageously laminated together using a pre-punched pre-preg material or a pressure sensitive adhesive.

18 Claims, 22 Drawing Sheets

U.S. PATENT DOCUMENTS

| | | | |
|---|---|---|---|
| 5,483,098 A | 1/1996 | Joiner, Jr. | |
| 5,644,163 A | 7/1997 | Tsuji et al. | |
| 5,900,670 A | 5/1999 | Schneider et al. | |
| 5,949,505 A | 9/1999 | Funamoto et al. | |
| 6,014,999 A * | 1/2000 | Browne | 156/512 |
| 6,108,205 A | 8/2000 | Bergstedt et al. | |
| 6,266,251 B1 | 7/2001 | Bassi et al. | |
| 6,274,924 B1 | 8/2001 | Carey et al. | |
| 6,295,405 B1 | 9/2001 | Jannson et al. | |
| 6,392,342 B1 | 5/2002 | Parikka et al. | |
| 6,407,411 B1 | 6/2002 | Wojnarowski et al. | |
| 6,498,355 B1 | 12/2002 | Harrah et al. | |
| 6,682,331 B1 | 1/2004 | Peh et al. | |
| 6,799,864 B2 | 10/2004 | Bohler et al. | |
| 6,803,653 B1 | 10/2004 | Likins et al. | |
| 6,861,747 B2 | 3/2005 | Miyazaki et al. | |
| 6,864,513 B2 | 3/2005 | Lin et al. | |
| 6,871,979 B2 | 3/2005 | Mai et al. | |
| 6,876,553 B2 | 4/2005 | Zhao et al. | |
| 6,879,263 B2 | 4/2005 | Pederson et al. | |
| 6,900,535 B2 | 5/2005 | Zhou | |
| 7,038,311 B2 | 5/2006 | Woodall et al. | |
| 2003/0019568 A1 | 1/2003 | Liu et al. | |
| 2003/0019569 A1 | 1/2003 | Kerr et al. | |
| 2003/0123228 A1 | 7/2003 | Bhatia et al. | |
| 2003/0146511 A1 | 8/2003 | Zhao et al. | |
| 2003/0189829 A1 * | 10/2003 | Shimizu et al. | 362/240 |
| 2004/0004435 A1 | 1/2004 | Hsu | |
| 2004/0201080 A1 | 10/2004 | Basoor et al. | |
| 2004/0222433 A1 * | 11/2004 | Mazzochette et al. | 257/99 |
| 2004/0223328 A1 | 11/2004 | Lee et al. | |
| 2004/0229391 A1 | 11/2004 | Ohya et al. | |
| 2004/0264195 A1 * | 12/2004 | Chang et al. | 362/294 |
| 2005/0017366 A1 | 1/2005 | Galli | |
| 2005/0024834 A1 | 2/2005 | Newby | |
| 2005/0029535 A1 | 2/2005 | Mazzochette et al. | |
| 2005/0035366 A1 | 2/2005 | Imai | |
| 2005/0056854 A1 | 3/2005 | Peh | |
| 2005/0094392 A1 | 5/2005 | Mooney | |
| 2005/0133810 A1 | 6/2005 | Roberts et al. | |
| 2005/0135067 A1 | 6/2005 | Park et al. | |
| 2005/0138800 A1 | 6/2005 | Mayer | |
| 2005/0161682 A1 | 7/2005 | Mazzochette et al. | |
| 2005/0174544 A1 | 8/2005 | Mazzochette | |
| 2006/0110123 A1 | 5/2006 | Duine et al. | |

FOREIGN PATENT DOCUMENTS

| | | |
|---|---|---|
| JP | 2002335019 A | 11/2002 |
| JP | 2003069083 A | 3/2003 |
| JP | 2002-191101 | 2/2004 |
| JP | 2004-008034 | 8/2004 |
| JP | 2004-342791 | 12/2004 |
| JP | 2005129710 A | 5/2005 |
| KR | 10-2001-00572 | 5/2001 |
| KR | 10200100572 | 5/2001 |
| KR | 10-2002-10314 | 9/2003 |
| KR | 10-2002-53730 | 3/2004 |
| KR | 10-2003-82108 | 5/2004 |
| KR | 10-2003-15145 | 9/2004 |
| KR | 10-2003-40648 | 9/2004 |
| KR | 10-2003-19154 | 10/2004 |
| KR | 10-2003-26351 | 11/2004 |
| KR | 10-2003-48324 | 11/2004 |

OTHER PUBLICATIONS

Luxpia Techical Spec., Product No. LWX1050(2004).
Di Feng et al, Novel Intergrated Light-Guide Plates for Liquid Crystal Display Backlight,: J. Opt.A: Pure Appl. Opt. 7: 11-117 (2005).
English Translation of Japanese Office Action dated Sep. 20, 2011for Japanese Application No. 2008-519472; Filing Date: Jun. 27, 2006; Title: "Light Emitting Diode Package and Method for Making Same".

* cited by examiner

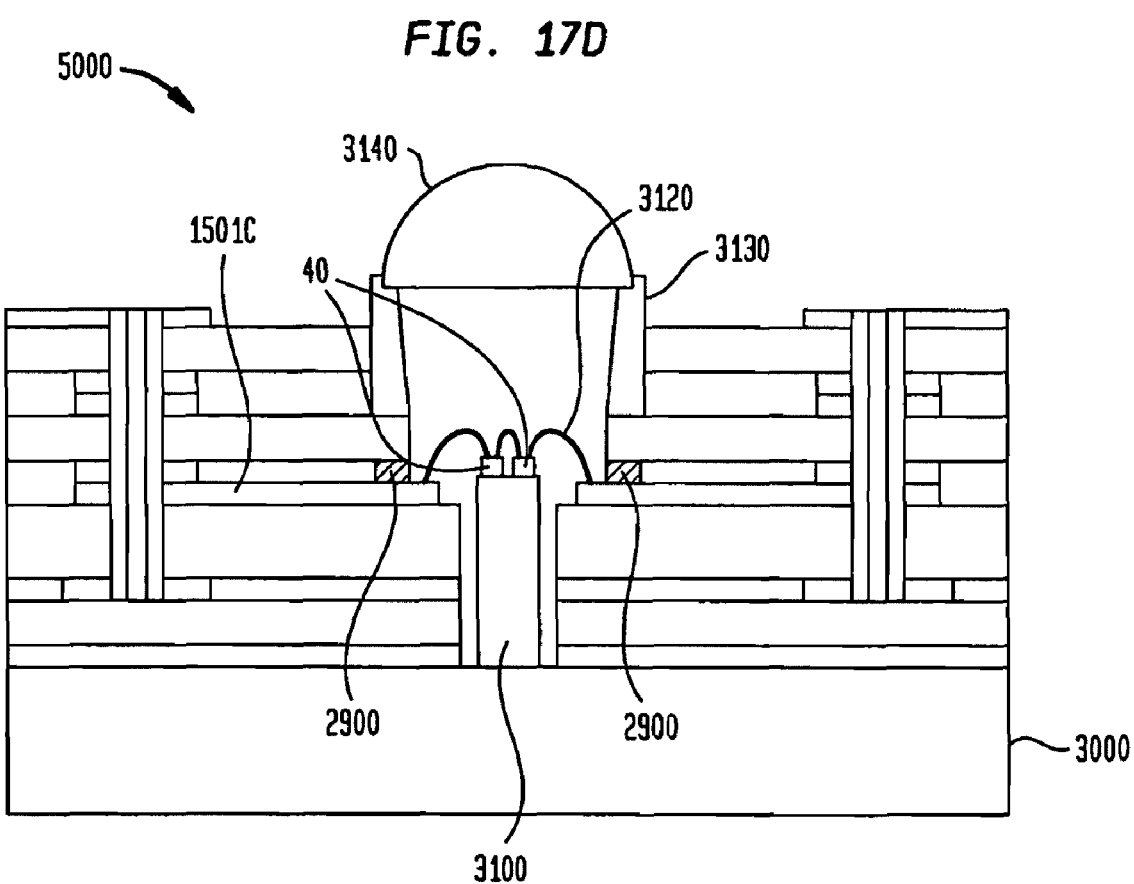

LED PACKAGE WITH STEPPED APERTURE

CROSS-REFERENCE TO RELATED APPLICATIONS

This application is a divisional application of U.S. patent application Ser. No. 11/475,292, filed Jun. 27, 2006, and claims the benefit of U.S. Provisional Application No. 60/694,788 filed on Jun. 27, 2005, U.S. Provisional Application No. 60/738,478 filed Nov. 21, 2005, and U.S. Provisional Application No. 60/763,828 filed Jan. 31, 2006. U.S. Provisional Application Nos. 60/694,788, 60/738,478, and 60/763,828, and U.S. patent application Ser. No. 11/475,292, are hereby incorporated by reference herein.

FIELD OF THE INVENTION

The present invention relates generally to a light emitting diode (LED) package and method for making same, and, in particular to a LED package adapted for high temperature operation.

BACKGROUND OF THE INVENTION

Conventional light emitting diode (LED) packages include a specialized, moldable plastic housing having a separate transparent cover exhibiting specific optical properties. Generally, these LED packages are designed exclusively for direct surface mount technology (SMT) connection to a printed wire board (PWB). However, because conventional packages require a special, molded plastic housing (i.e., liquid crystal polymer) and optical element, the packages are not well suited for multi-die arrays that may be easily, quickly, and inexpensively modified to suit a particular lighting application.

Another fabrication and design challenge faced by high-temperature operation LED packages is the need to effectively manage the heat generated by the array of LEDs. Traditionally, to deal with heat management issues, conventional LED packages include a large, homogeneous metal carrier or heat sink, which spans the entire bottom of the LED package. The metal carrier is generally composed of a relatively expensive material (e.g., molybdenum copper), adding significant cost to the fabrication of the LED package. Accordingly, there is a need in the art for an improved light emitting package adapted for high temperature operation in a variety of lighting applications.

SUMMARY OF THE INVENTION

The present invention relates to a LED package assembly including a PWB having one or more through-holes or apertures. Inserted into each of the apertures is a heat sink stud to form an integrated/monolithic assembly. According to an embodiment of the present invention, one or more light sources (i.e., LED die) may be placed (directly) on the heat sink stud, which carries away the heat generated by the LED die. In application, the assembly may be mounted on an external component, such as an external heat sink. Advantageously, the use of discretely-sized heat sink studs, integrated into the PWB allows for a compact, versatile and cost-efficient construction.

According to an embodiment of the present invention, the LED package assembly utilizes PWB techniques, SMT assembly techniques, and/or chip-on-board (COB) semiconductor die attachment techniques. Advantageously, the LED package assembly of the present invention reduces the cost and design cycle time for light emitting components, and is suitable for use in a variety of lighting applications including but not limited to general illumination, accent lighting, electronic display illumination, machine vision, etc. Advantageously, an array of LED die may be arranged in a single, low-cost, versatile package which is operable in high temperature environments.

According to an embodiment of the present invention, a LED package may be fabricated by thermally coupling one or more heat sink studs to an external heat sink, placing a printed wire board (substrate) over the external heat sink, wherein the printed wire board (substrate) includes one or more openings/apertures in registration with the one or more heat sink studs, and mounting one or more LED die to each of the one or more heat sink studs, wherein the heat sink studs are embedded at least partially in the external heat sink.

The one or more LED die are electrically connected to the printed wire board, preferably to one or more conductors attached to the PWB, preferably by a wire bond. Optionally, one or more reflectors may be arranged on the printed wire board, such that the one or more reflectors form a cavity at least partially surrounding the one or more LED die. An encapsulant material may be introduced into the cavity in order to cover or encapsulate the LED die.

According to an embodiment of the present invention, the one or more heat sink studs may be thermally coupled to the external heat sink using a thermal grease. In addition, the PWB may include one or more castellations, adapted to allow the LED package to be assembled onto a secondary component, such as a mother PWB.

According to an embodiment of the present invention, an outer edge of the heat sink studs may be knurled to allow the heat sink studs to be fitted within the corresponding opening of the printed wire board. Optionally, the openings of the PWB may plated with a solderable material, such that the solderable material may be flowed to join the PWB and the heat sink stud.

According to an embodiment of the present invention, a LED package may comprise an external heat sink, one or more heat sink studs in thermal contact with the external heat sink, a printed wire board overlying the external heat sink, wherein the printed wire board includes one or more openings aligned with the one or more heat sink studs, and one or more LED die mounted on each of the one or more heat sink studs. The one or more heat sink studs may be embedded in the external heat sink. In addition, one or more reflectors may be attached to the printed wire board, wherein each of the one or more reflectors forms a cavity around the one or more LED die. Preferably, the printed wire board may comprise a standard fiberglass reinforced epoxy laminate material (FR4) or a high temperature fiberglass reinforced epoxy laminate material (FR4-5) and the LED die is composed of a material having a thermal coefficient of expansion (TCE) that is closely matched to that of the heat sink stud material. Preferably, the one or more sink studs comprise a high thermal conductivity material, such as copper molybdenum copper. Optionally, the LED package may comprise multi-color LEDs.

An exemplary LED package according to an embodiment of the present invention may comprise an external heat sink, a formed heat sink thermally connected to the external heat sink, a PWB mounted above the formed heat sink, and one or more LED die mounted on the formed heat sink.

An exemplary LED package according to an embodiment of the present invention may comprise a metal layer, a PWB having one or more layers and a cavity, wherein the printed wire board is mounted on the metal layer, one or more isolators or interposers disposed in the cavity of the PWB and mounted on the metal layer, and one or more LED die mounted on the isolator wherein the isolator comprises a material having a TCE that matches that of the one or more LED die mounted thereon. Preferably, the metal layer may comprise copper. Optionally, an encapsulant may be disposed over the one or more LED die. According to another option, the LED assembly may further comprise a reflector attached to the PWB.

According to an embodiment of the present invention, a method is provided for fabricating an LED assembly including a stepped cavity formed or buried in a multi-layer PWB structure. The multi-layer PWB structure includes a plurality of layers of PWB secured together using one or more adhesive layers. According to an embodiment of the present invention, the adhesive is a pressure sensitive adhesive (PSA). According to another embodiment of the present invention the adhesive layers are comprised of pre-impregnated composite fiber, herein referred to as "pre-preg" material.

BRIEF DESCRIPTION OF THE DRAWINGS

The features and advantages of the present invention will be apparent from the description of the preferred embodiment(s) presented below considered in conjunction with the attached figures, of which:

FIGS. 17A-17D illustrate a cross section of an exemplary multi-layer LED package at different stages of a fabrication process, according to an embodiment of the present invention.

It is to be understood that these figures are representative in nature for purposes of illustrating the concepts of the invention and may not be to scale, and are not intended to be exacting in all details.

DETAILED DESCRIPTION OF THE INVENTION

The present invention relates to light emitting packages, and methods for making same, wherein the light emitting package comprising at least one light emitting assembly including a printed wired board having one or more heat sink studs integrated therein to form a monolithic integrated base for mounting one or more light sources thereon. As used herein, the term "package" or "LED package" is intended to include, but is not limited to, an LED assembly comprising one LED or an array of LEDs, according to the present invention. As used herein, the term "array" is intended to refer to a plurality of elements, and is not intended to be limited to elements arranged in regular columns and/or rows. According to an embodiment of the present invention, the LED package may include an array of LED assemblies, with each LED assembly including an array of LED die.

According to an embodiment of the present invention, the one or more light sources comprise light emitting diode (LED) die. According to this embodiment of the present invention, each of the one or more LED die are mounted directly on a heat sink stud. The heat sink stud may be pressed or otherwise attached to the external heat sink. The external heat sink may be composed of aluminum, copper, or other suitable material having high thermal conductivity. The heat sink studs may be composed of copper, aluminum, or other suitable material with high thermal conductivity. A high thermal conductivity material, such as tungsten copper, with a TCE that is close to that of the LED die may be used to reduce thermal mismatch stresses. Preferably, a thermal material, such as for example thermal grease or conductive epoxy, may be disposed between the assembly and the external heat sink to strengthen the mechanical and thermal connection therebetween.

Figure 1:
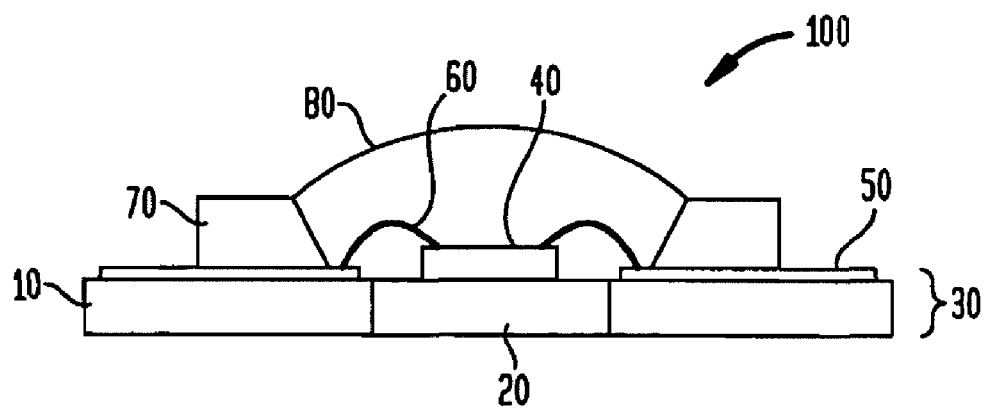
FIG. 1 shows a side cross-section view of a LED package, according to an embodiment of the present invention.

The present invention relates to a LED package fabricated using widely-available PWB material as a basis for the LED package. FIG. 1 illustrates an exemplary LED package 100, shown here with a single LED die 40, including a PWB 10 having one or more pre-formed through-holes or apertures. A heat sink stud or slug 20 is inserted into each of the apertures to form a base assembly 30 for packaging one or more light sources (e.g., LED die 40). One having ordinary skill in the art will appreciate that the aperture may be formed in the PWB 10 by drilling, stamping, punching, or other suitable technique. According to an embodiment of the present invention, the PWB 10 may include any number of parts disposed on a large panel.

The PWB 10 may be constructed using any of a variety of commonly used PWB materials including, but not limited to, a standard fiberglass reinforced epoxy laminate such as Flame Retardant 4 (FR4), woven PTFE, polyamide, etc. Optionally, multi-layer PWB structures may be used to minimize total board size, among other design reasons appreciated by one having ordinary skill in the art.

In a preferred embodiment, the PWB 10 has a working temperature of approximately 150 C. An exemplary PWB 10 suitable for use in the present invention is the commercially available high temperature fiberglass reinforced epoxy laminate such as Flame Retardant 4-5 (FR4-5). One having ordinary skill in the art will appreciate that other suitable printed wire boards may be used in the present invention, selected in accordance with the desired operating specifications of the assembly.

A heat sink stud 20 is inserted into each of the apertures of the PWB 10 to form an integral, monolithic base assembly 30. One having ordinary skill in the art will appreciate that the heat sink stud 20 may be fixed within the aperture of the PWB 10 using an adhesive or by soldering. Alternatively, the heat sink stud 20 may be secured in the PWB 10 using a suitable mechanical means to hold the heat sink in place over a variety of environmental conditions, such as temperature changes and mechanical stresses (PWB flexure).

According to an embodiment of the present invention, the outer edge of the heat sink stud 20 may be knurled for fitting the heat sink stud 20 into the aperture of the PWB 10. The knurls may be arranged such that they dig into the PWB 10 to form a fitted connection between the two components.

According to an embodiment of the present invention, the heat sink stud 20 and the aperture of the PWB 10 are shaped and dimensioned such that the heat sink stud 20 may be pressed into the PWB 10 to form a tight friction fit.

According to another embodiment, the perimeter edges of the PWB aperture may be plated or lined with a solderable material. To form the base assembly 30, the heat sink stud 20 may be pressed into the aperture and heated (to approximately 250° C.) causing the solder to flow and bond the heat sink stud 20 to the PWB 10.

According to yet another embodiment, the heat sink stud 20 may be peened. The peened heat sink stud 20 is fitted within the PWB aperture. Next, a peening tool may be used to mechanically stretch the perimeter of the heat sink stud 20 such that the heat sink stud 20 is forced into the sides of the aperture and locked in place. Optionally, the heat sink stud 20 may be pressed into the PWB 10 in panel form.

One having ordinary skill in the art will appreciate that the heat sink stud 20 may be inserted and fixed within the PWB 10 using any combination of techniques described above or otherwise known in the art.

According to an embodiment of the present invention, the heat sink stud 20 may be made of copper, aluminum, molybdenum copper, or other suitable high-thermal conductivity material. Optionally, the heat sink stud 20 may be fabricated using an electrically conductive material or an insulating material, such as, for example, aluminum nitride.

Referring to FIG. 1, the assembly 30 may be used as a substrate or base for a light source (or LED) package 100. According to an embodiment of the present invention, a light source, such as a LED die 40, may be placed directly on the heat sink stud 20 of the assembly 30. According to this arrangement, the heat generated by the LED die 40 is dissipated by the heat sink stud 20, thus allowing for high temperature operation of the LED package 100. Advantageously, in order to improve LED die performance reliability, a heat sink stud 20 material may be selected which has a thermal coefficient of expansion (TCE) that is closely matched to that of the LED die 40. For example, the heat sink stud 20 may comprise tungsten copper, copper molybdenum copper, aluminum nitride, copper, or boron nitride.

According to an embodiment of the present invention, one or more conductors 50 may be provided on the PWB 10 for external electrical connections and for making electrical connections to the LED die 40, using, for example, wire-bonds 60.

The LED package 100 may include a reflector 70 for providing improved light extraction or for beam forming. Arrangement of the reflector 70 may also provide a cavity surrounding the LED die 40, as shown in FIG. 1, that protects the LED die 40 and provides a retention area for encapsulation of the LED die 40 with, for example, an epoxy resin or silicone. The reflector 70 may be composed of any suitable material, such as a high-temperature plastic (e.g., a liquid crystal polymer, or other suitable plastic), ceramic, aluminum, or other optically reflective and electrically insulating material. Optionally, the reflector material may also compose electrically conductive materials, such as, for example, aluminum or nickel, provided an electrically insulating layer is disposed between the reflector 70 and each of the one or more PWB conductors 50. Optionally, the reflector 70 may be attached to the PWB 10 using any suitable adhesive.

According to an embodiment of the present invention, the LED die 40 may be attached to the heat sink stud 20 using any common chip-and-wire materials, such as an epoxy or solder. Encapsulation of the LED die 40 may be carried out by dispensing an encapsulant 80 into the reflector 70. Optionally, the optical element may be a transparent dome, disposed on and attached to the LED package 100 as a secondary component. The transparent dome may be attached in the LED package 100 using the encapsulant 80 as an adhesive, using a secondary adhesive, or by any suitable mechanical retention means. Although FIG. 1 shows an LED package 100 including a single LED die 40, one having ordinary skill in the art will appreciate that the package may include any number of LED die 40.

Figure 2:
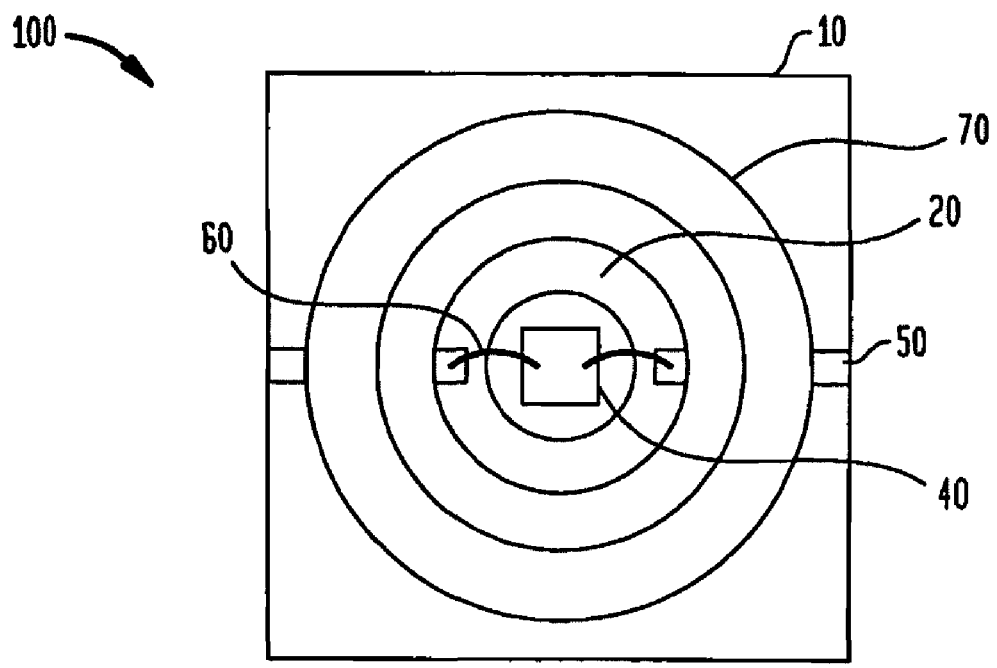
FIG. 2 shows a top view of a LED package, according to an embodiment of the present invention.

FIG. 2 shows a top view of an exemplary LED package 100, according to an embodiment of the present invention. As shown, external electrical connections may be made to the LED die 40 by attaching it to the one or more PWB conductors 50.

Figure 3:
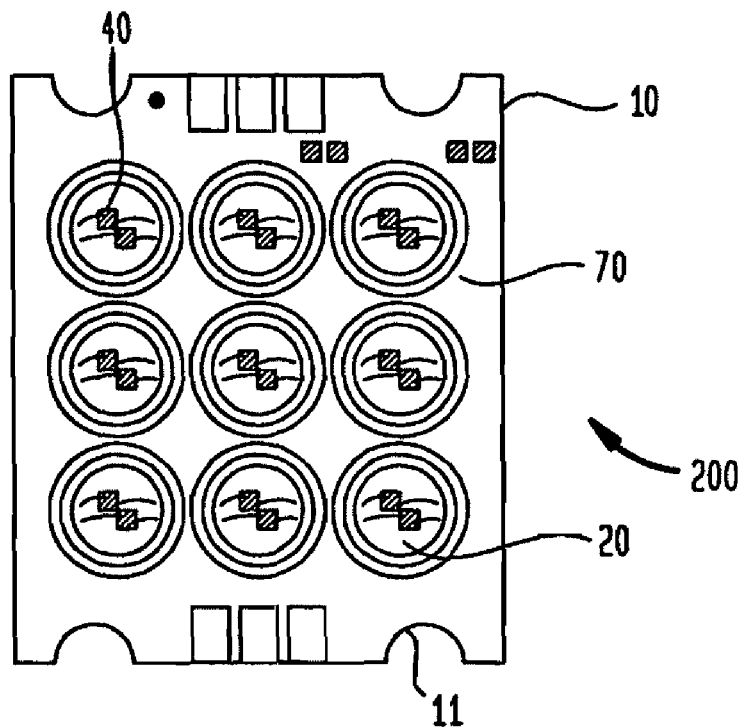
FIG. 3 illustrates a top view of a LED package including an array of LED assemblies, according to an embodiment of the present invention.

FIG. 3 shows an exemplary LED package including an array of LED assemblies, according to an embodiment of the present invention. As shown in FIG. 3, pairs of LED die 40 are connected to separate heat sink studs 20 to form LED assemblies. The array of LED assemblies are packaged together into a single LED array package 200. Spreading the heat sink studs 20 out over the PWB 10 reduces any stress that may result from a TCE mismatch between the materials of the PWB 10 and one or more of the heat sink studs 20. Mounting holes 11 are provided for part-mounting to ensure a mechanical connection and to minimize the resistance of the thermal connection both initially, and over time.

Figure 4:
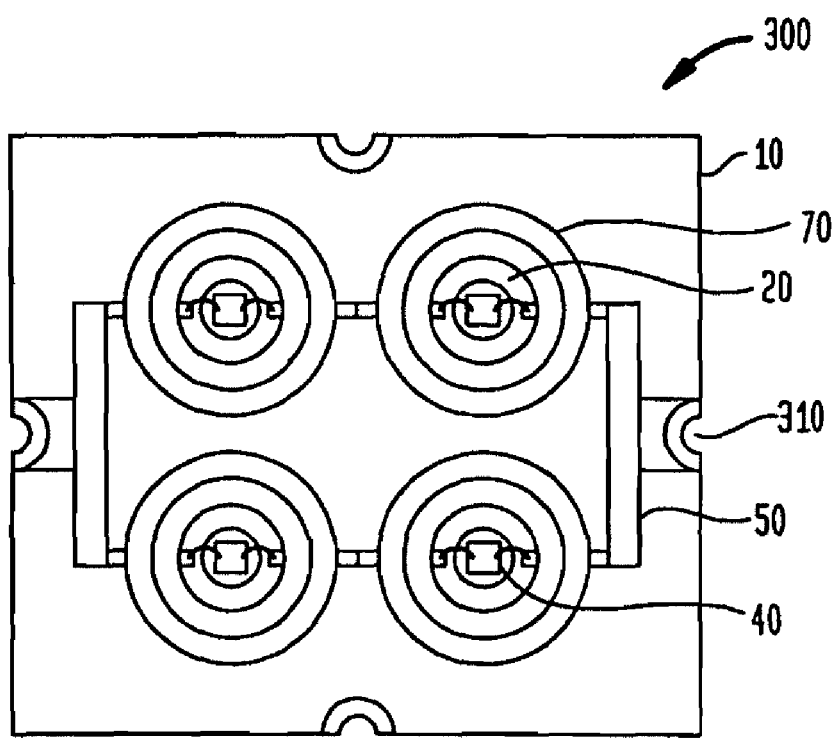
FIG. 4 shows a top view of a LED package including an array of LED assemblies, wherein the package includes castellations for SMT-type mounting, according to an embodiment of the present invention.

FIG. 4 depicts an exemplary LED array package 300 wherein the PWB 10 of the LED array package 300 includes terminals (e.g., metallized inset terminations), known as castellations 310, adapted for making one or more external connections (e.g, physical and/or electrical connections). The castellations 310 are useful for assembling the LED array package 300 onto a secondary component, such as a larger PWB (not shown in FIG. 4), using, for example, Surface Mount Technology (SMT) techniques. Optionally, the castellations 310 may be soldered or plated, to facilitate the mounting of the entire LED package 310 to another PWB or other secondary component.

Figure 5:
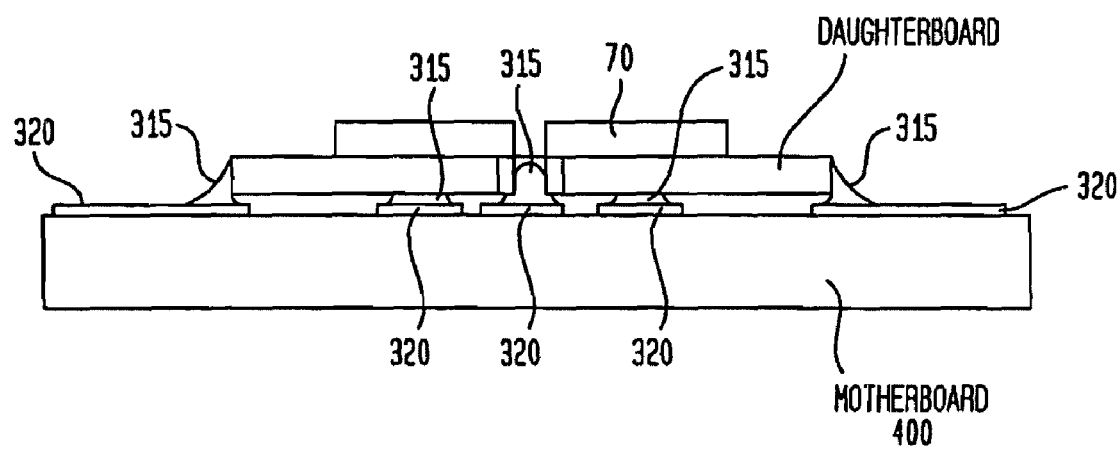
FIG. 5 illustrates a side view of a LED package including castellations mounted upon a secondary PWB using a SMT technique, according to an embodiment of the present invention.

FIG. 5 shows a side view of the LED package 300 depicted in FIG. 4 ("daughter board") mounted and/or soldered onto a larger PWB 400 ("mother board") using common SMT techniques. The thermal connections to the heat sink studs may be made using any suitable material having a low thermal resistance, such as, for example, conductive epoxy, thermal grease, or solder. According to an embodiment of the present invention, solder or epoxy fillets 315 may be used to connect the daughter board 300, at the sites of the one or more castellations, to a conductive region 320 of the mother board 400.

Figure 6:
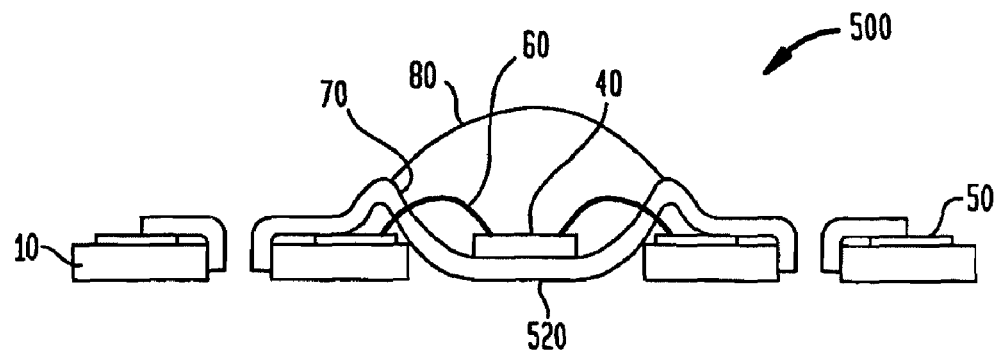
FIG. 6 shows a side cross section view of a LED package including a formed heat sink providing a reflective cavity, according to an embodiment of the present invention.
Figure 10:
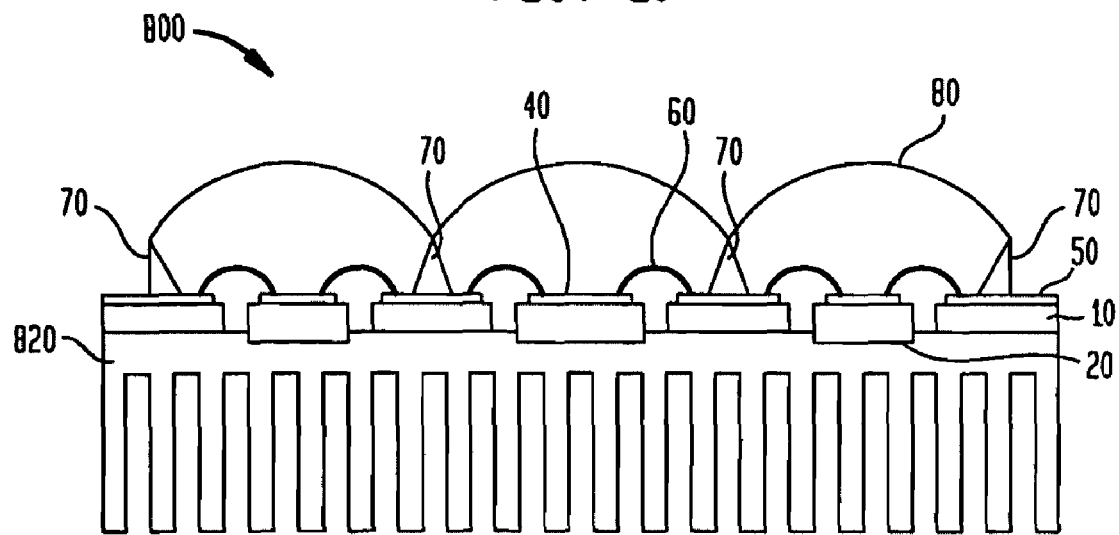
FIG. 10 shows a side cross section view of a LED array package including a direct external heat sink connection, according to an embodiment of the present invention.

FIG. 6 shows yet another embodiment of the present invention wherein the LED package 500 includes a sheet-like heat sink which is formed with concavities which align or register with one or more apertures of the PWB 10, herein referred to as a formed heat sink 520. According to this embodiment of the present invention, at least a portion of the formed heat sink 520 (i.e., a concavity) is pressed into or otherwise inserted into the apertures of the PWB 10. The end portions of the formed heat sink 520 may extend out of the aperture and are attached to the surface of the PWB 10. One having ordinary skill in the art will appreciate that the ends of the formed heat sink 520 may be attached directly to the surface of the PWB 10, or attached to a PWB conductor 50 (as shown in FIG. 10). As shown, the formed heat sink 520 may be arranged such that it forms a pocket or cavity for disposal therein of one or more LED die 40. The formed heat sink 520 may be attached to the PWB 10 using any suitable adhesive or mechanical attachment technique.

Optionally, the cavity portion of the formed heat sink 520 may be composed of, or coated with, a reflective material, such as for example aluminum or nickel, to provide a reflective cavity 70 around the one or more LED die 40. The formed heat sink cavity may be filled with an encapsulant 80 to protect and manage the light extraction from the LED die 40. According to this embodiment of the present invention, the formed heat sink 520 may be composed of any suitable thermally conductive material, such as, for example, aluminum or copper. Optionally, the sheet-type heat sink layer 520 may also be composed of a material that is both thermally conductive and has a TCE that is closely matched to the LED die 40, such as tungsten copper or copper-molybdenum-copper.

Figure 7:
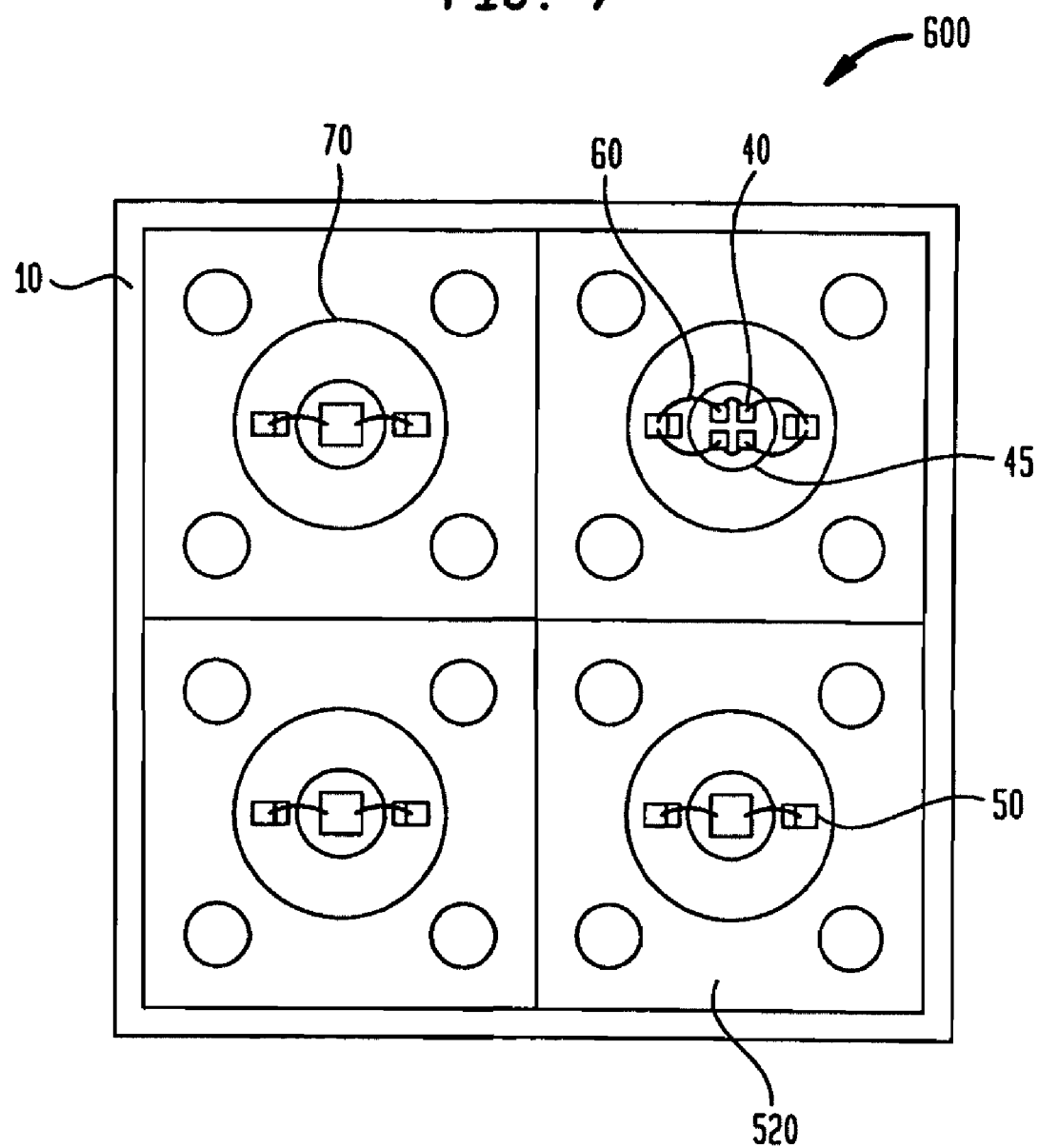
FIG. 7 depicts a top view of a LED array package including a formed heat sink, according to an embodiment of the present invention.

FIG. 7 shows a top view of a LED array package 600 including a formed heat sink 520, as described in connection with FIG. 6 above. One having ordinary skill in the art will appreciate that, according to this embodiment of the present invention, the formed heat sink 520 may be isolated (i.e., one heat sink per LED die 40 or LED cluster 45). Alternatively, according to an embodiment of the present invention, there may be one solid, formed heat sink 520 upon which all LED die 40 and LED clusters 45 are arranged. As shown in FIG. 7, the formed heat sink 520 may include one or more openings for allowing the connection of the one or more wire bonds 60 to the PWB conductors 50. Optionally, a solder mask, or other electrically insulating layer, may be provided between the formed heat sink 520 and the PWB conductors 50 to prevent making an electrical connection between the electrical conductor and the formed heat sink 520.

Figure 8:
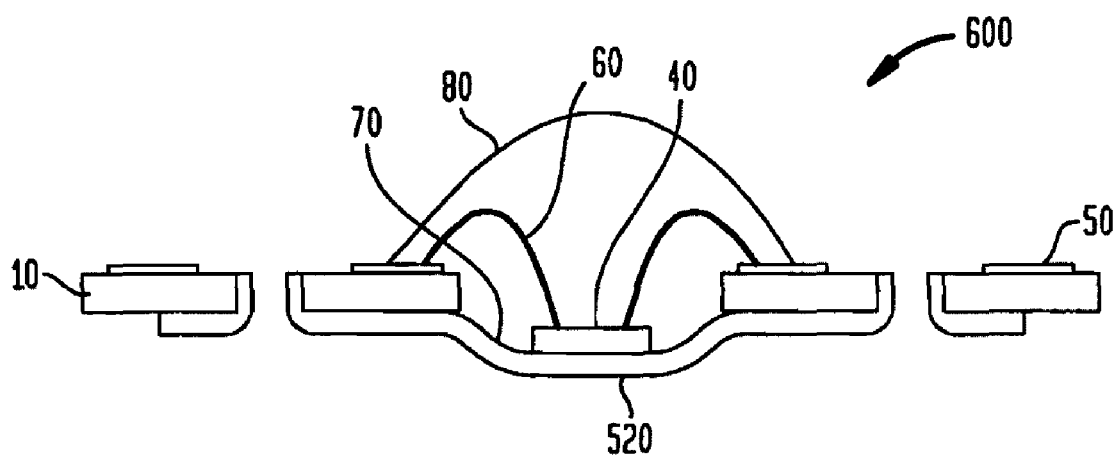
FIG. 8 shows a side cross section view of a LED package including a PWB arranged above a formed heat sink, according to an embodiment of the present invention.

FIG. 8 depicts a LED package 600 wherein the PWB 10 is mounted above the formed heat sink 520, which is formed with concavities in registration with the apertures of the PWB 10. As described above, the formed heat sink 520 may be shaped such that it forms a cavity 70 in which the one or more LED die 40 may be disposed. By disposing the formed heat sink 520 below the PWB 10, an improved thermal connection may be made to an external heat sink. One having ordinary skill in the art will appreciate that the formed heat sink 520 may be attached to the PWB 10 using any suitable means, including an adhesive or a mechanical means.

Figure 9:
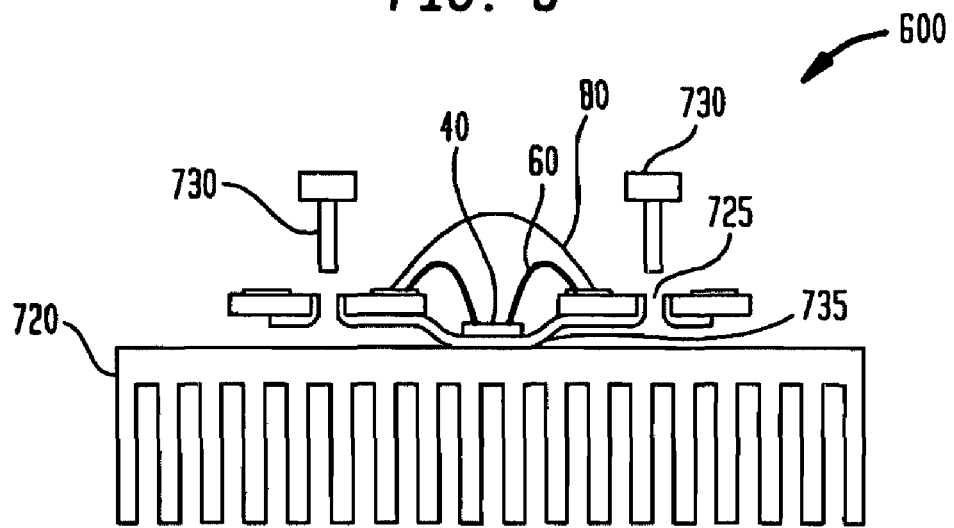
FIG. 9 shows a side cross section view of a LED array package including a PWB arranged above a formed heat sink thermally coupled to an external heat sink, according to an embodiment of the present invention.

FIG. 9 shows an LED package 600 according to embodiment of the present invention in a typical connection arrangement with an external heat sink 720. Materials and construction for the embodiment depicted in FIGS. 8 and 9 are similar to the those depicted in FIG. 6 and described in detail above. Optionally, as shown in FIG. 9, one or more holes, or eyelets 725, may be punched or otherwise formed in the formed heat sink 520. The eyelets are adapted to accept a securing mechanism, such as a screw or rivet, for connecting the formed heat sink 520. For example, one or more clamping screws 730 may be used to secure together the formed heat sink 520, the PWB 10, and the external heat sink 720. Optionally, the LED package 600 and the external heat sink 720 may be joined using a suitable adhesive, such as, for example, thermal grease 735.

FIG. 10 illustrates an embodiment of the present invention wherein one or more grooves, notches, or holes are formed in the surface of an external heat sink 820. One or more heat sink studs 20 are pressed into the grooves of the external heat sink 820. Once the heat sink studs 20 are pressed or attached in place, a PWB 10, having openings or apertures aligning with the heat sink studs 20 is laid over the protruding heat sink studs 20 and attached to the external heat sink 820. The LED dice 40 are then mounted on the heat sink studs 20. Optionally, reflectors 70 are arranged around each of the LED dice 40, using, for example, an adhesive. Further, the LED dice 40 may be electrically connected to the PWB conductor 50 using one or more wire bonds 60, and may be encapsulated by encapsulant 80.

Optionally, the LED package 800 may be attached to the external heat sink 820 by a low thermal resistance connection where the heat sink stud 20 is pressed into the external heat sink 820, and between the external heat sink stud 820 and the PWB 10. The low thermal resistance attachment may be made using, for example, a thermally-conductive epoxy, thermal grease, solder, or other suitable material. Heat produced by each of the one or more LED die 40 during operation is carried away from the LED die 40 through the heat sink stud 20, and into the external heat sink 820. Advantageously, removing the heat generated by the LED die 40 increases both the LED die life and the light output. Another advantage of this arrangement is that it eliminates the additional expenses associated with adding the thermal resistance of a secondary assembly. Although FIG. 10 depicts the LED package 800 attached to the external heat sink 820, one having ordinary skill in the art will appreciate that the LED package 800 may be attached to or mounted on any suitable component.

Figure 11:
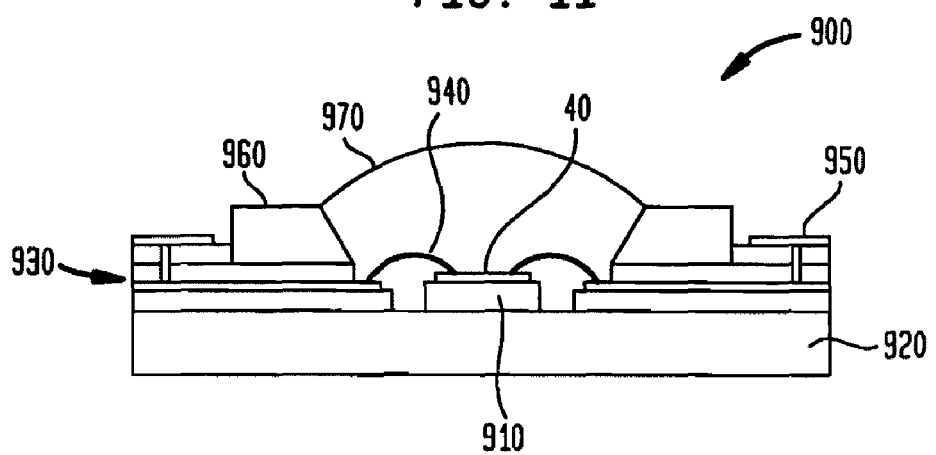
FIG. 11 shows a side cross section view of a LED package including an isolator, according to an embodiment of the present invention.

FIG. 11 illustrates a LED package 900 according to an embodiment of the present invention, wherein a metal layer 920 is disposed underlying a PWB 930. The metal layer 920 may be attached or laminated to the PWB 930 using any suitable PWB laminate (e.g., pressure sensitive adhesive or pre-punched pre-preg material) according to any suitable lamination process. The metal layer 920 may be composed of any suitable material having a high thermal conductivity (TC) and a low TCE, such as, for example, copper.

The LED package 900 further includes one or more LED die 40 arranged on an isolator 910. The isolator 910 and LED die 40 assembly are disposed in an aperture or cavity formed in a PWB 930, as shown in FIG. 11. The one or more LED die 40 may be attached to the isolator 910 using any suitable attachment means including, but not limited to, a conductive epoxy, a solder, etc.

As shown in FIG. 11, the isolator 910 may be attached directly to the metal layer 920, according to any suitable attachment means or material, such as conductive epoxy, solder, brazing, mechanical means, etc. One having ordinary skill in the art will appreciate that in fabrication, the isolator 910 and LED die 40 assembly may be disposed on the metal layer 920, followed by the disposition of the PWB 930 onto the metal layer 910 such that the aperture or cavity of the PWB 930 aligns with or corresponds to the isolator 910 and LED die 40 assembly. Alternatively, one having ordinary skill in the art will appreciate that the PWB 930 may be disposed on the metal layer 920, followed by the disposition of the isolator 910 and LED die 40 assembly in the aperture or cavity of the PWB 930.

The PWB 930 may comprise one or more layers, and may include one or more PWB conductor layers 930A. The LED die 40 may be electrically connected to the PWB conductor layer(s) 930A using any suitable connection means, such as a wire bond 940, as shown in FIG. 11. In addition, a solder pad 950 may be disposed on the PWB 930.

According to an embodiment of the present invention, the isolator 910 is composed of a material adapted to tolerate expansion excursions cause by the heat produced by the attached LED die 40. Preferably, the isolator 910 is composed of a material that has a TCE that approximately matches the TCE of the LED die 40. Suitable TCE-matching materials that may be used in accordance with the present invention include, but are not limited to, copper-molybdenum-copper (CuMoCu), tungsten-copper (WCu), aluminum-silicon-carbide (AlSiC), aluminum nitride (AlN), silicon (Si), beryllium oxide (BeO), diamond, or other material that has a TCE that is matched to that of the LED.

According to an embodiment of the present invention, the LED package 900 may include a reflector 960 disposed on a layer of the PWB 930 to provide improved light extraction and/or for efficient beam forming. As described above, the reflector 960 may be composed of any suitable high temperature plastic (e.g., liquid crystal polymer), a ceramic material, or other optically reflective and electrically insulating material. The reflector 960 may be attached to the PWB 930 using any suitable adhesive.

Figure 12:
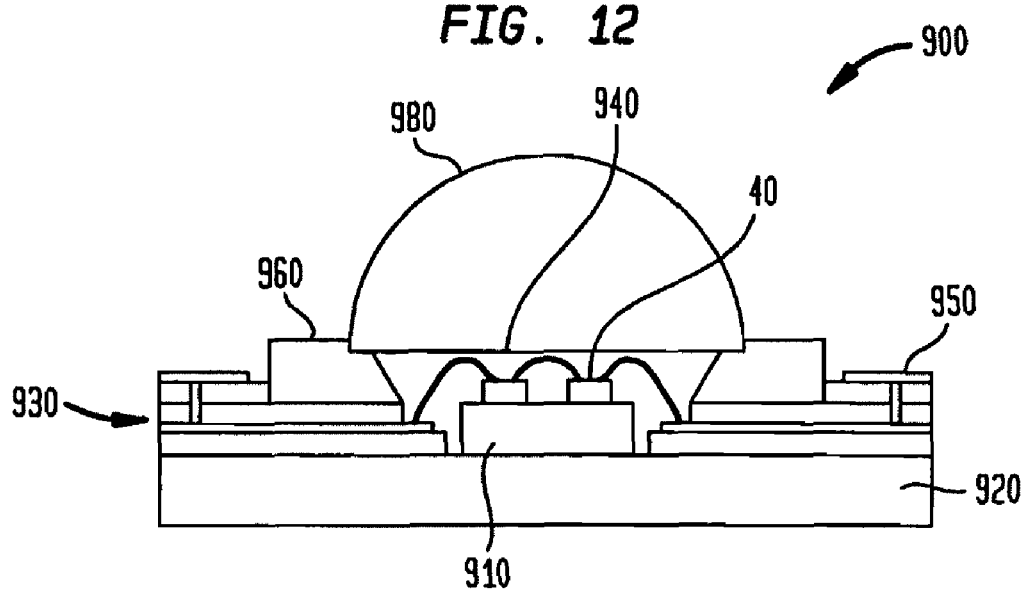
FIG. 12 shows a side cross section view of a LED package including an isolator and an optical element, according to an embodiment of the present invention.

According to an embodiment of the present invention, an encapsulant 970 may be disposed in the cavity of the PWB 930 such that the encapsulant 970 covers all or a portion of the LED die 40. The encapsulant material may be composed of any suitable transparent optical material. Optionally, as shown in FIG. 12 and as described above in conjunction with FIG. 1, a secondary optical element 980, such as a transparent dome, may be disposed over the LED die 40. According to an embodiment of the present invention, the optical element may be attached in the LED package 900 using an encapsulant 970 or other adhesive. Furthermore, as shown in FIG. 12, a plurality of LED dice 40 may be mounted on the isolator 910, to form an LED assembly including an array of LED dice 40, included within a single LED package 900.

Figure 13:
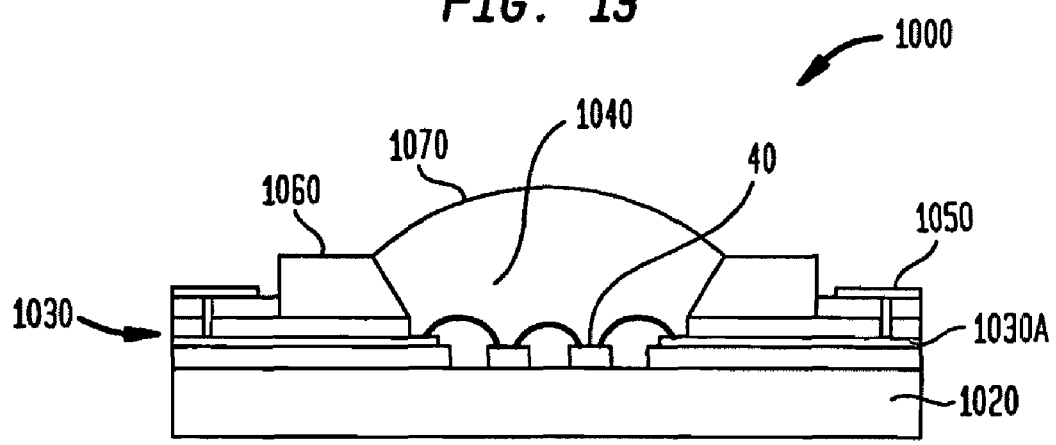
FIG. 13 shows a side cross section view of a LED package including one or more LED die disposed directly on a metal layer composed of a TCE matching material.

FIG. 13 illustrates an exemplary LED package 1000, according to an embodiment of the present invention, which is similar to LED package 900 described above in conjunction with FIG. 12. In this embodiment, however, the one or more LED die 40 are attached directly to a metal layer 1020 composed of a material having a TCE that matches that of the LED die 40. The metal layer 1020 is preferably a low TCE material, such as, for example, copper-molybdenum-copper (CuMoCu), tungsten-copper (WCu), aluminum-silicon-carbide (AlSiC), aluminum nitride (AlN), silicon (Si), beryllium oxide (BeO), diamond, or other material that has a TCE that is matched to that of the LED die 40. The LED die 40 may be attached or adhered to the TCE-matching metal layer 1020 using a conductive epoxy, solder, or other suitable attachment means or material.

Advantageously, the heat generated by the LED die 40 and the stresses associated with the thermal expansion of the LED die 40 and the metal layer 1020 are efficiently managed by using the TCE-matching metal layer 1020.

The one or more LED die 40 are disposed within a cavity of a PWB 1030. The PWB 1030 may be comprised of one or more layers, and include a conductive layer 1030A that is electrically connected to the LED die 40 using any suitable connection means, such as, for example, a wire bond 1040.

According to an embodiment of the present invention, the LED package 1000 may include a reflector 1060 attached to the PWB 1030 and at least partially surrounding the LED die 40. Optionally, the LED package 1000 may comprise an encapsulant 1070 dispensed in the cavity of the PWB 1030 and/or the reflector 1060, such that it at least partially covers the LED die 40.

Figure 14:
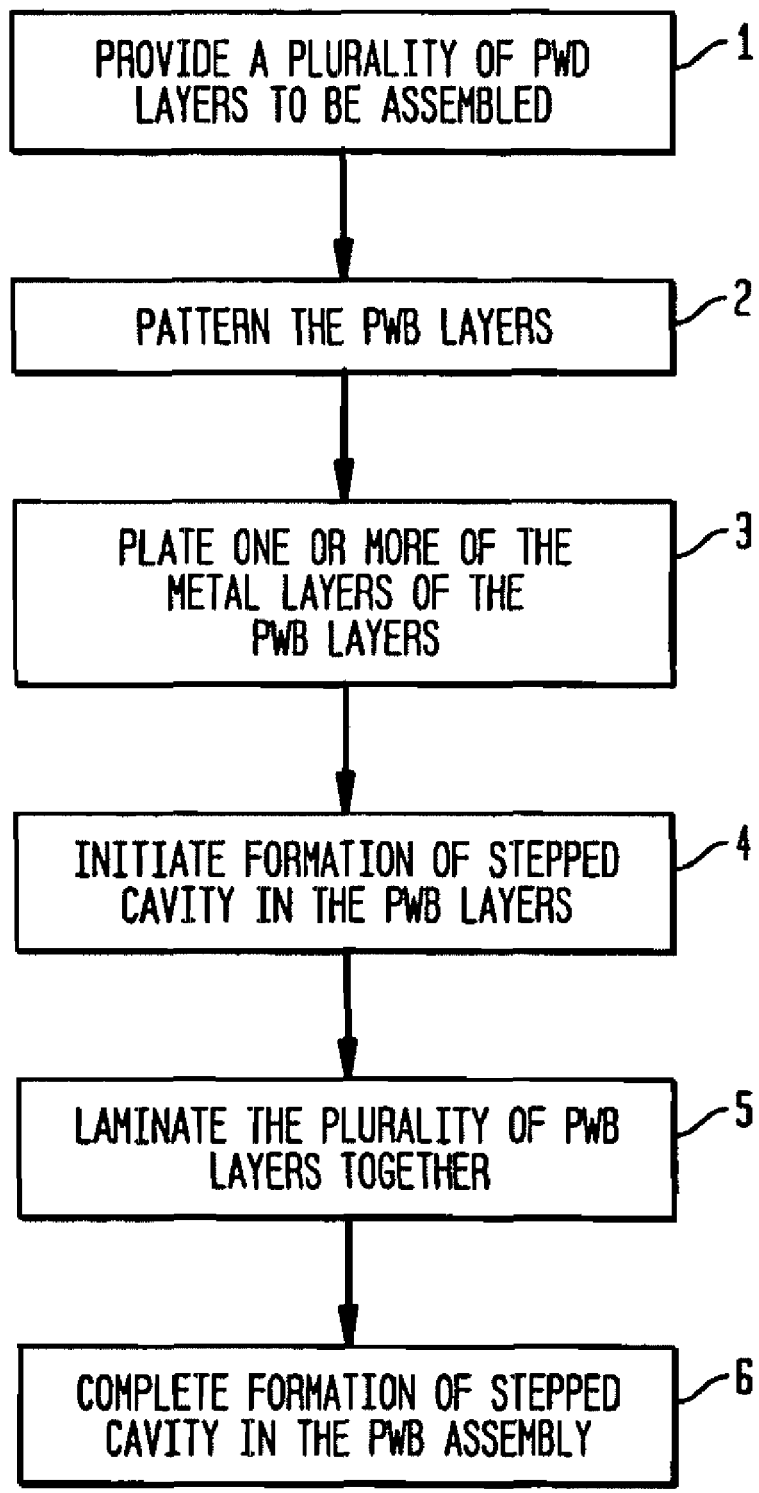
FIG. 14 illustrates the steps of an exemplary process for fabricating a PWB assembly having a stepped cavity, according to an embodiment of the present invention.

According to yet another embodiment of the present invention, a method is provided for fabricating a multi-layer PWB assembly having a stepped cavity formed therein, particularly suited for housing light emitting devices, such as, for example, one or more LED die 40. According to an embodiment of the present invention, the stepped cavity is buried in the PWB assembly. The present invention further relates to a PWB assembly including a stepped cavity made according to the fabrication method. In addition, the present application describes a method for fabricating a LED package comprising a PWB assembly having a stepped cavity FIG. 14 illustrates an exemplary process for fabricating a PWB assembly having a stepped cavity, according to an embodiment of the present invention. FIGS. 15A-15I depict an exemplary PWB assembly at different stages of the fabrication process illustrated in FIG. 14 and described in detail below. FIG. 15I depicts an exemplary PWB assembly 2000 including a stepped cavity 1900, fabricated according to an embodiment of the present invention.

In step 1, a number of PWB layers 1500 to be assembled are provided. Although the exemplary embodiment described herein and illustrated in FIGS. 14 and 15A-15I includes three PWB layers 1500A, 1500B, 1500C, one having ordinary skill in the art will appreciate that the PWB assembly 2000 may include any suitable number of PWB layers 1500. One having ordinary skill in the art will appreciate that each of the PWB layers 1500A, 1500B, 1500C may comprise any suitable number of layers.

Figure 15A:
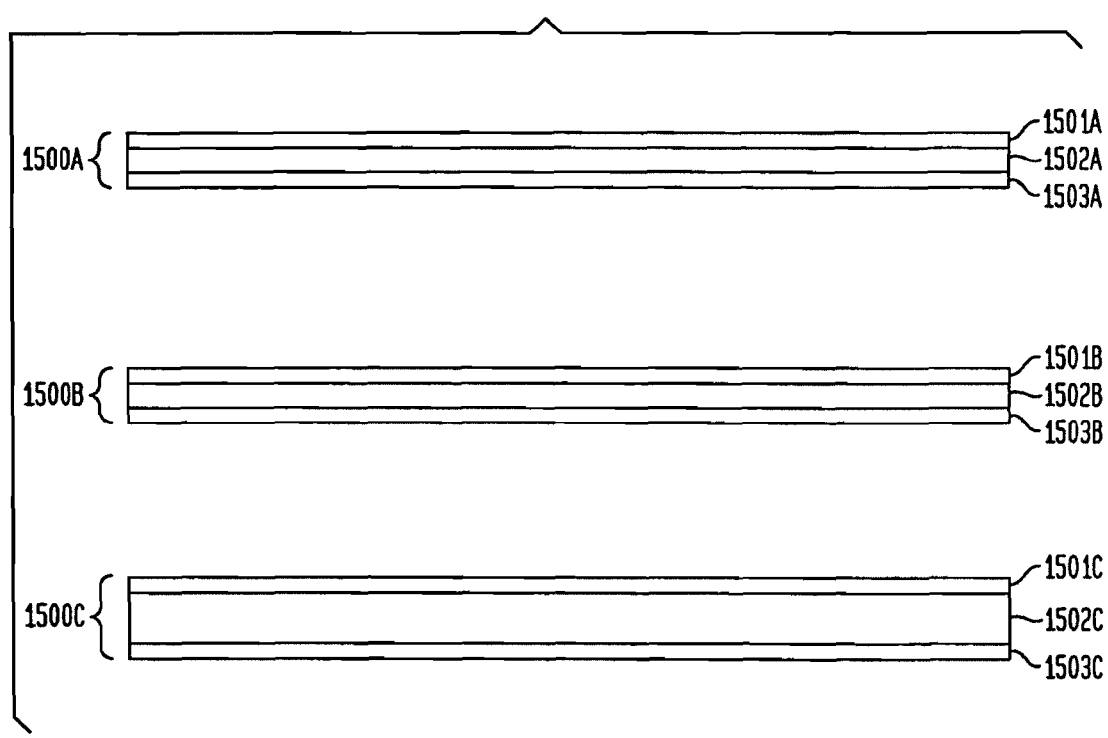
FIG. 15A-15I illustrate a cross section of an exemplary PWB assembly with stepped cavity at different stages of a fabrication process, according to an embodiment of the present invention.

According to an exemplary embodiment of the present invention, each of the PWB layers 1500A, 1500B, 1500C comprises a double sided FR4 (or FR4-5) board, which includes a dielectric layer (e.g., a layer of FR4 material) 1502 disposed between a top metal layer 1501 and a bottom metal layer 1503, as shown in FIG. 15A. The metal layers 1501, 1503 of the PWB layer 1500 may be composed of any suitable metal, including but not limited to copper.

The PWB layers 1500A, 1500B, 1500C may be of any suitable thickness (e.g., approximately 0.002 inches thick). According to an embodiment of the present invention, the bottom-most PWB layer (1500C in FIG. 15A) is thicker than the other PWB layers (e.g., approximately 0.004 inches thick).

Figure 15B:
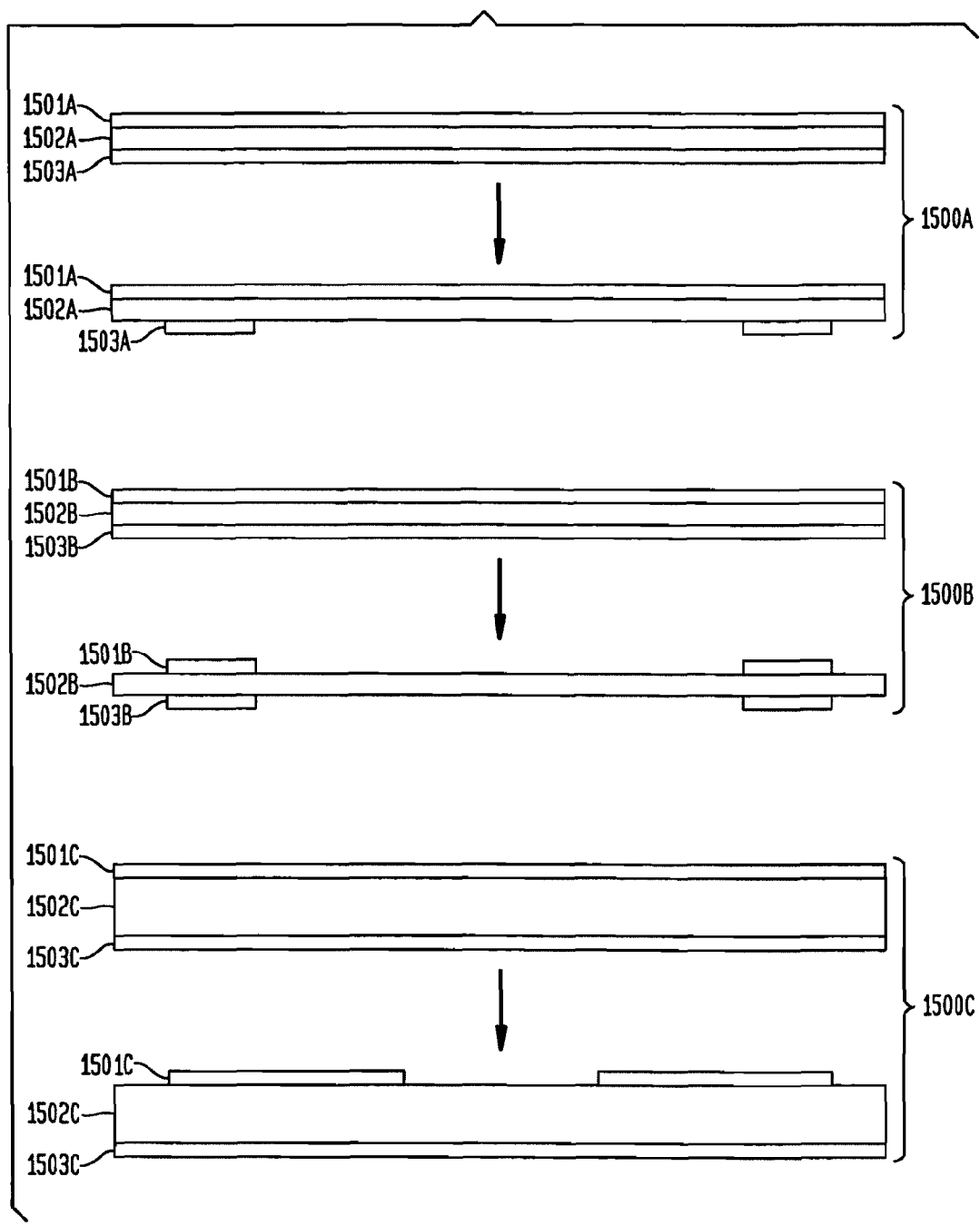
Figure 15C:
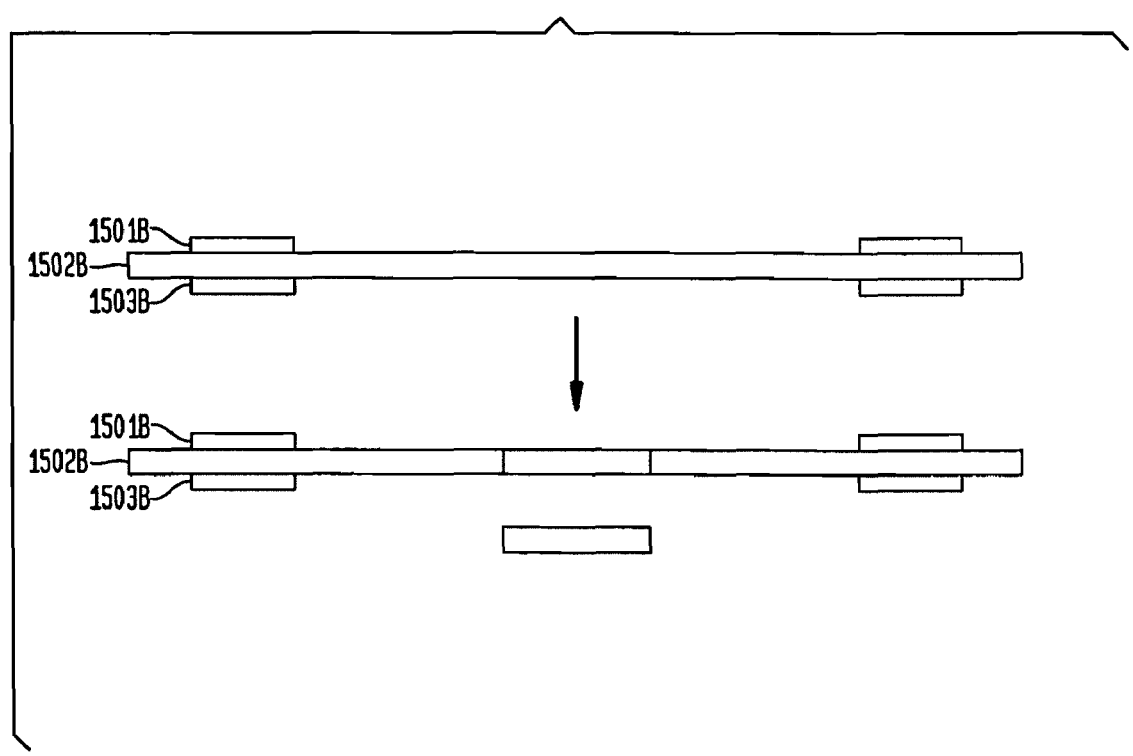

In step 2, one or more of metal layers 1501, 1503 are patterned with wiring traces appropriately to enable assembly of the PWB layers such that the metal portions of the individual PWB layers are properly aligned for desired interconnection. For example, as shown in FIG. 15B, the bottom metal layer 1503A of PWB layer 1500A is patterned to include features adapted for assembly with adjacent PWB layer 1500B, and so on, as described in detail below.

Optionally, in step 3, one or more of the metal layers 1501, 1503 may be plated with a suitable metal for electrical connectivity with a light emitting device. Any suitable material may be used for the plating, such as, for example, nickel or gold.

In step 4, the process of forming a stepped cavity is initiated. Specifically, an aperture is formed in the dielectric layer 1502 of each of the one or more intermediate PWB layers. In the exemplary embodiment illustrated in FIG. 15C, the aperture or hole is formed in the dielectric layer 1502B of PWB layer 1500B. One having ordinary skill in the art will appreciate that the aperture may be of any suitable size and/or shape, such as a circle, square, etc. In addition, the aperture may be formed according to any suitable method, such as, for example, punching, routing or drilling.

Figure 15D:
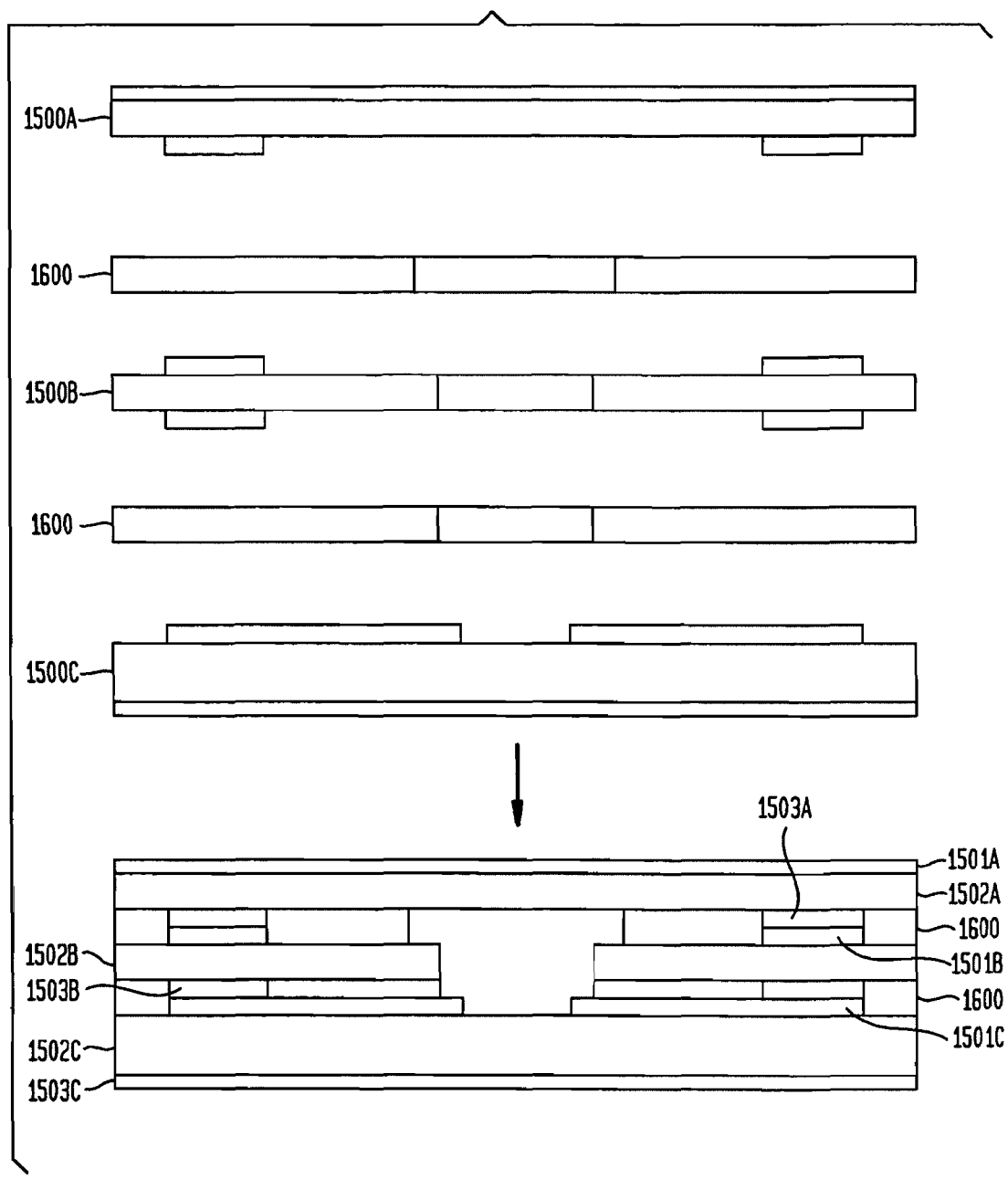

In step 5, the plurality of PWB layers 1500A, 1500B, 1500C are laminated together, as shown in FIG. 15D to form a multi-layer PWB structure. To laminate the PWB layers together, a suitable adhesive layer 1600 is disposed in between each adjacent PWB layer, and the layers are pressed together. The adhesive layer 1600 may be comprised of any suitable adhesive material. According to an embodiment of the present invention, the adhesive layer 1600 is composed of a suitable pressure sensitive adhesive (PSA), such as, for example, 3M™ High Tack Tape PSA 3794. According to another embodiment of the present invention, the adhesive layer 1600 may be composed of a pre-punched pre-preg material, such as, for example, Arlon 49N and Arlon 37N.

Figure 15E:
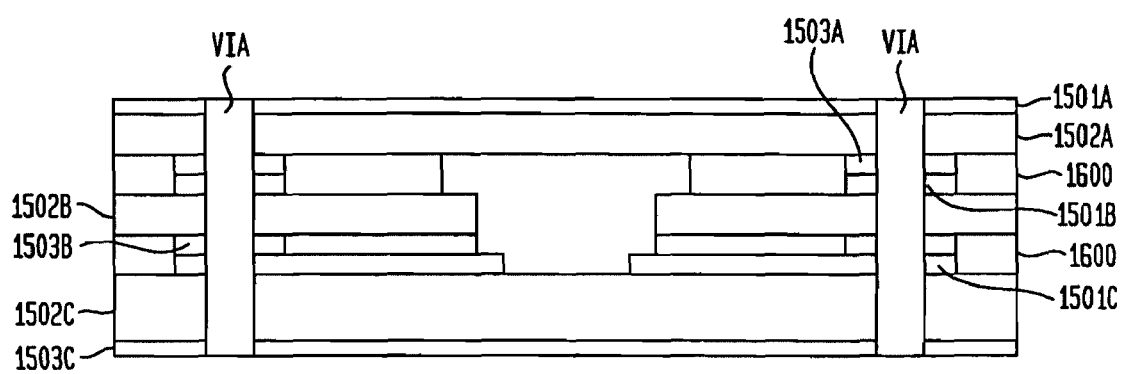
Figure 15F:
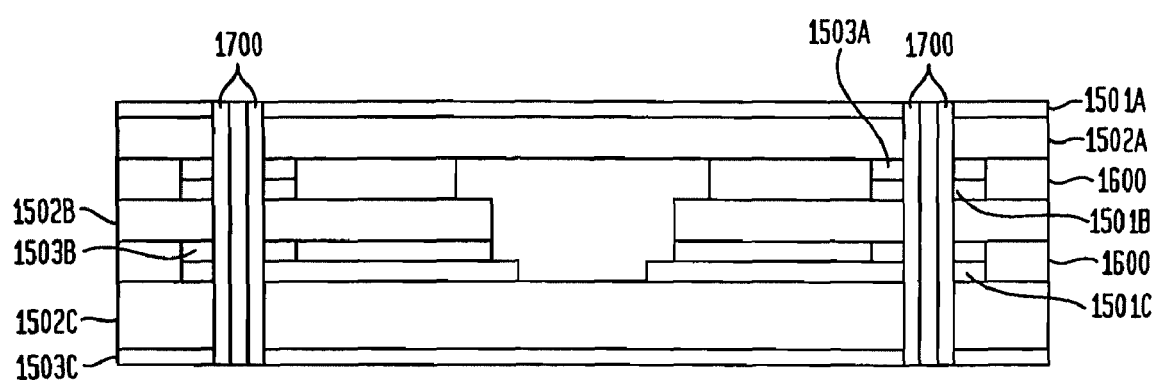

Optionally, via holes may be formed through the PWB layers 1500A, 1500B, 1500C according to any suitable method (e.g., drilling), as shown in FIG. 15E. In addition, the via holes may be plated with a suitable metallization material 1700 (e.g., copper) for electrical continuity, as shown in FIG. 15F.

Figure 15G:
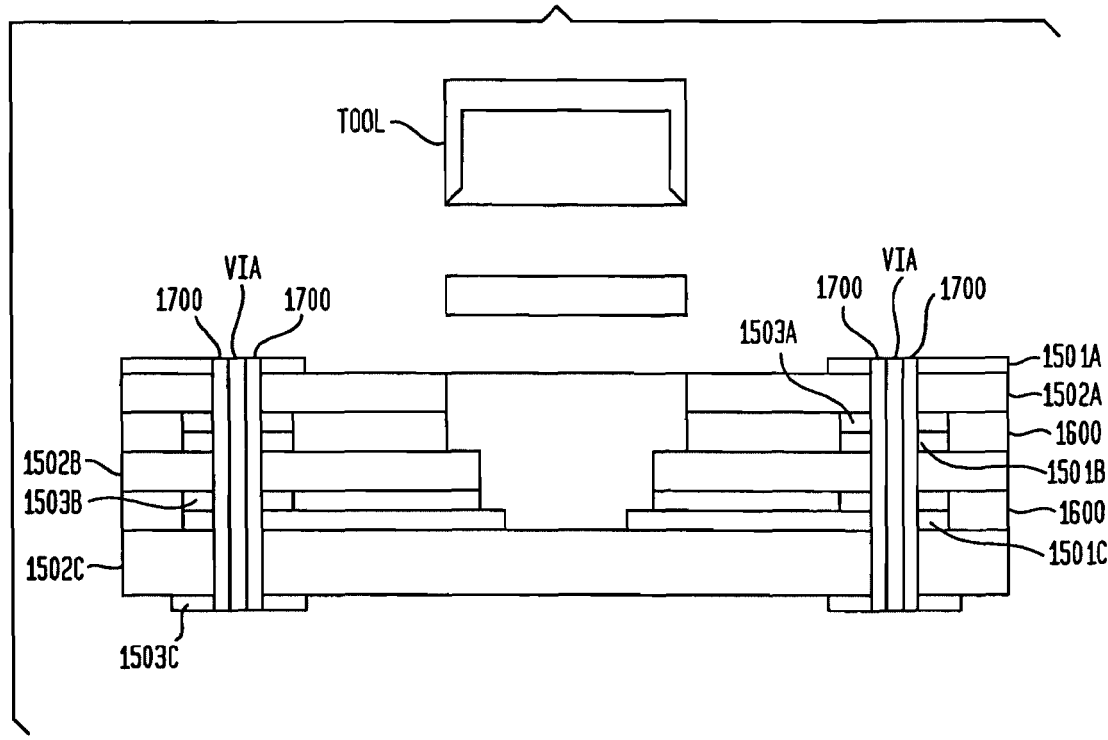
Figure 15H:
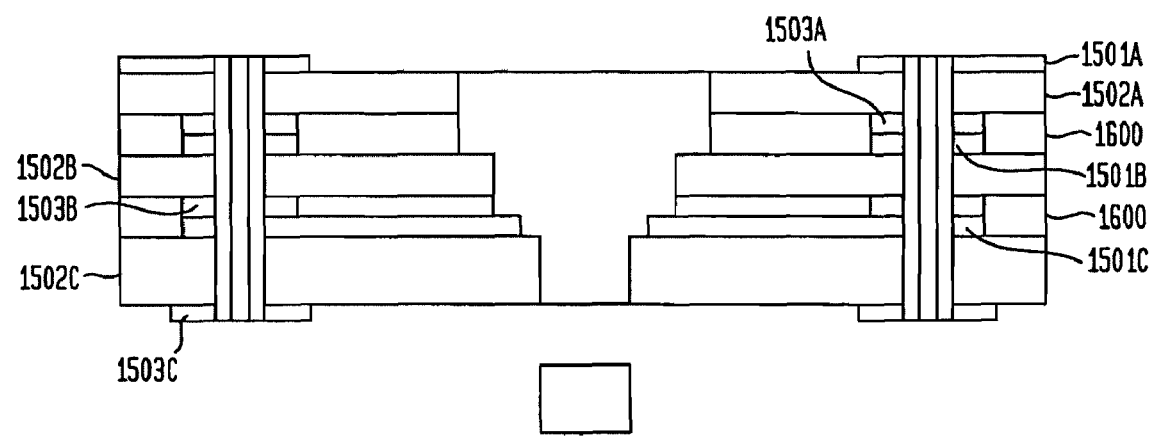
Figure 15I:
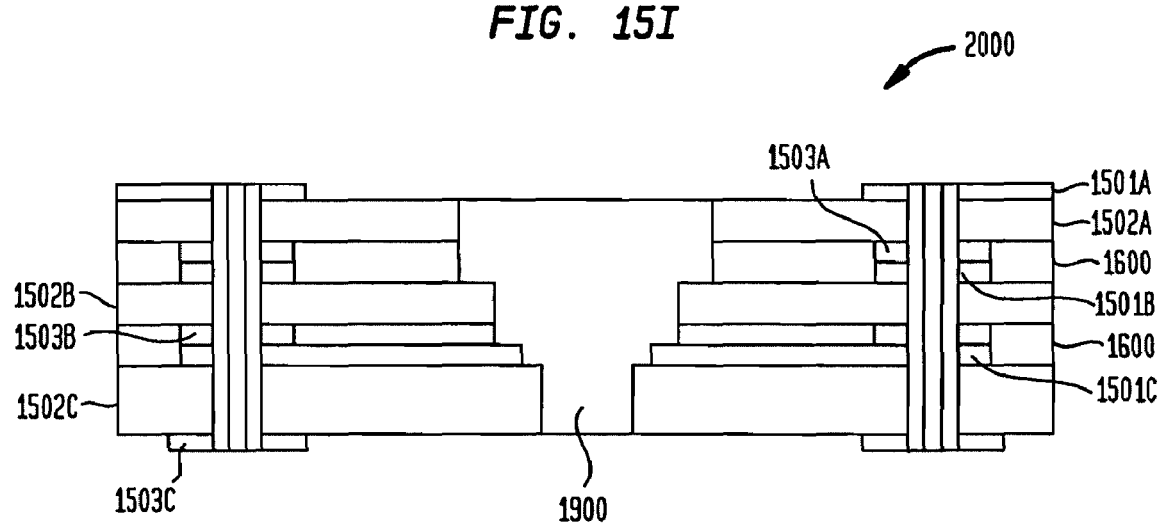

In step 6, formation of the stepped cavity in the PWB assembly is finalized, by removing at least a portion of the top and bottom dielectric layers 1502A and 1502B. According to an embodiment of the present invention, a portion of the top dielectric layer 1502A is removed using any suitable technique or tool, such as, for example, a piercing tool, a routing tool or a flat bottom drill, as shown in FIG. 15G. Furthermore, in step 6, a portion of the bottom dielectric layer 1502C is removed, as shown in FIG. 15H.

As a result of the process described in detail above with reference to FIG. 14, the PWB assembly 2000 including a stepped cavity 1900 is formed, as shown in FIG. 15I.

According to an embodiment of the present invention, the PWB assembly 2000 with stepped cavity 1900 may be used to fabricate a LED package, particularly those suited for high temperature operation.

Figure 16:
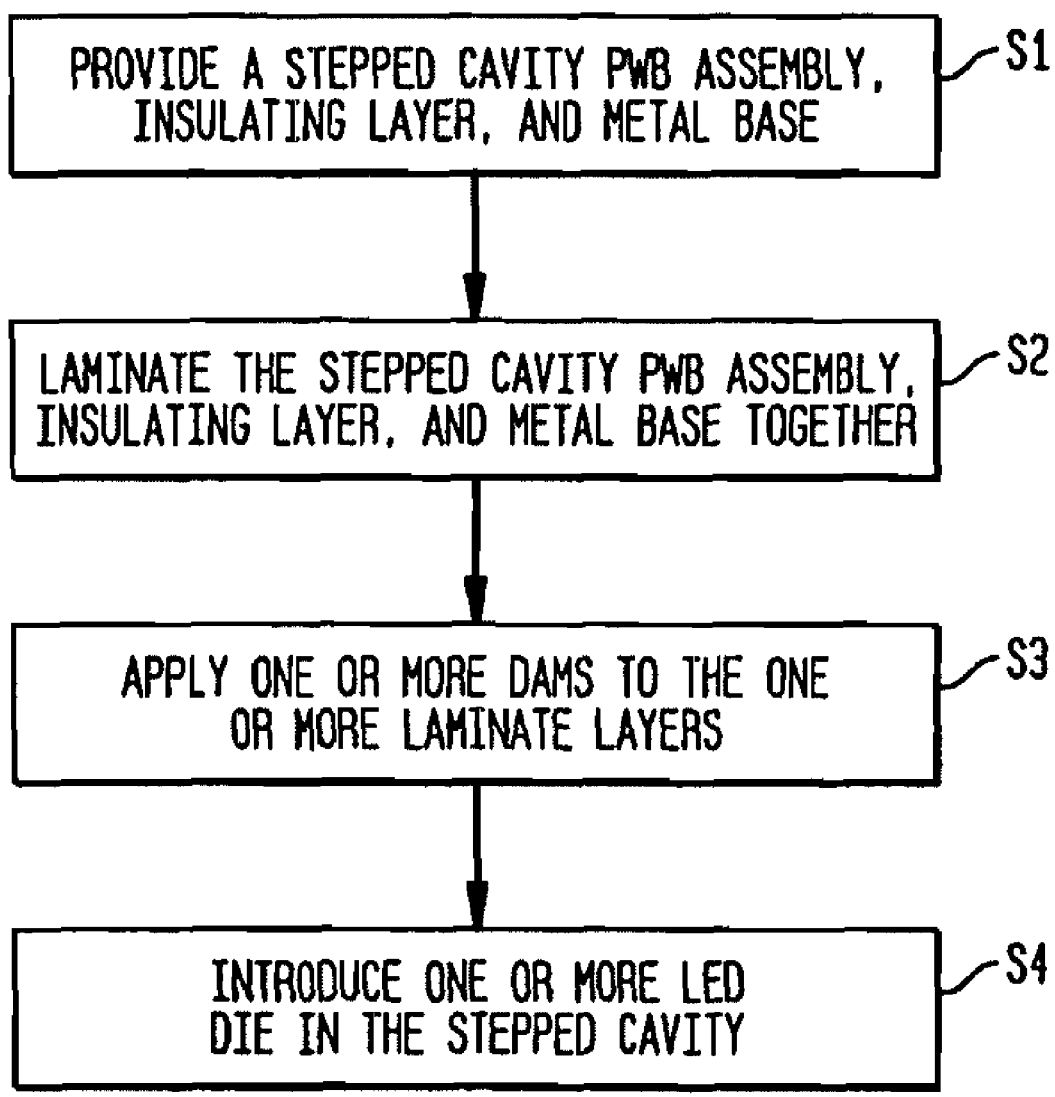
FIG. 16 illustrates the steps of an exemplary process for fabricating a LED package including a PWB having a stepped cavity.

FIG. 16 illustrates an exemplary process for the fabrication of a LED package 5000 (shown in FIG. 17D) including a stepped-cavity PWB assembly 2000. One having ordinary skill in the art will appreciate that the steps set forth in the process illustrated in FIG. 16, and described in detail below, do not necessarily need to be performed in the order provided.

Figure 17A:
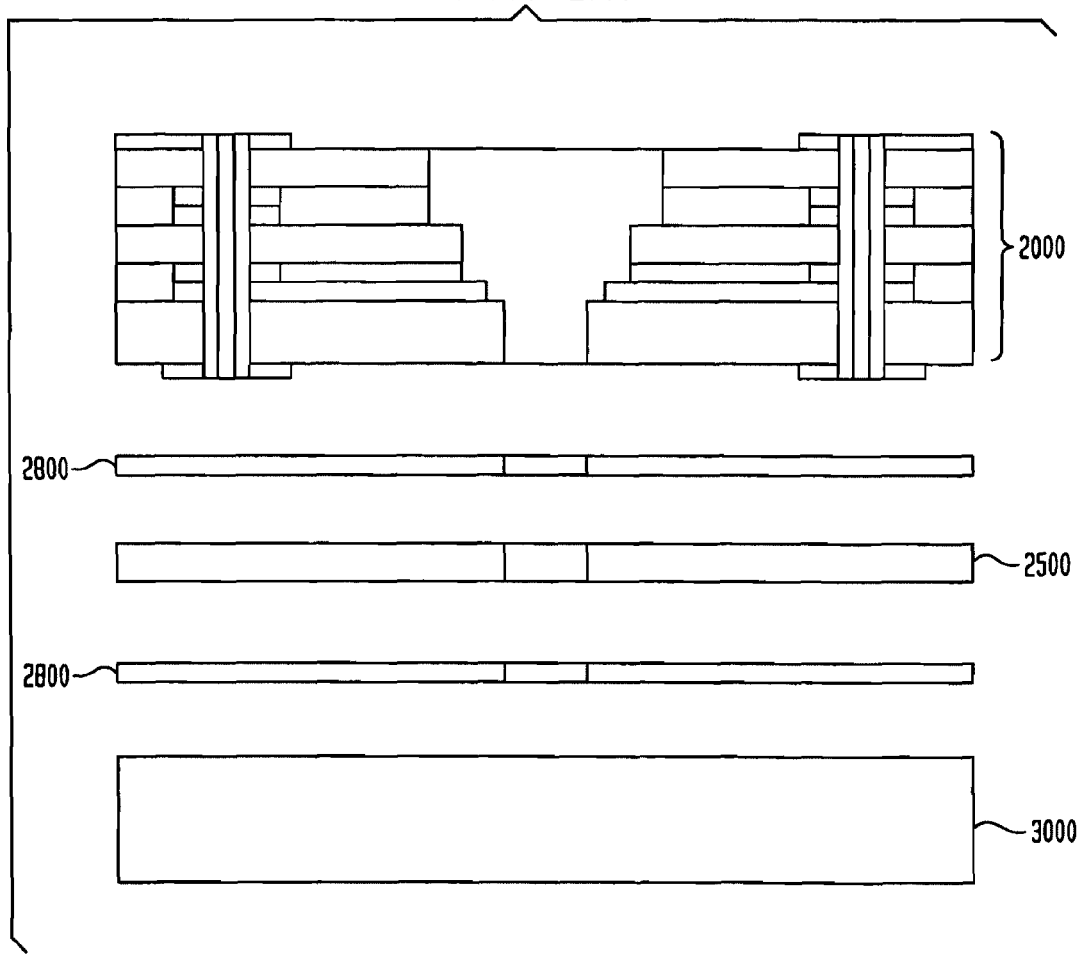

In step S1, as shown in FIG. 17A, a layer is provided which acts to electrically isolate the electrical connections of the PWB assembly 2000 from a metal base 3000. One having ordinary skill in the art will appreciate that the "insulating layer" 2500 may be composed of any suitable dielectric material. According to an embodiment of the present invention, the insulating layer 2500 may be comprised of a PWB layer. The PWB layer may be composed of any suitable material, such as for example, a fiberglass reinforced material (e.g., FR4 board) or a high temperature fiberglass reinforced material (e.g., FR4-5 board). The insulating layer 2500 includes an aperture or hole 2510 adapted to correspond to the bottommost opening of the stepped cavity of the PWB assembly 2000, as shown in FIG. 17A. According to another embodiment of the present invention, the insulating layer 2500 may be comprised of one or more pre-preg layers having a desired voltage breakdown. Preferably, a breakdown voltage of greater than or equal to 250 Volts is maintained. The insulating layer 2500 may be of any suitable thickness. Preferably, the insulating layer 2500 is at least approximately 0.002 inches thick.

The metal base 3000 is provided which serves as a heat sink in the LED package 5000. According to an embodiment of the present invention, the metal base 3000 may be composed of any suitable metal, such as, for example, copper. In addition, the metal base 3000 may be of any suitable thickness sufficient to manage the heat generated by the one or more LED die of the LED package 5000. The insulating layer 2500 advantageously isolates the plated vias of the PWB assembly 2000 from the metal base 3000.

Figure 17B:
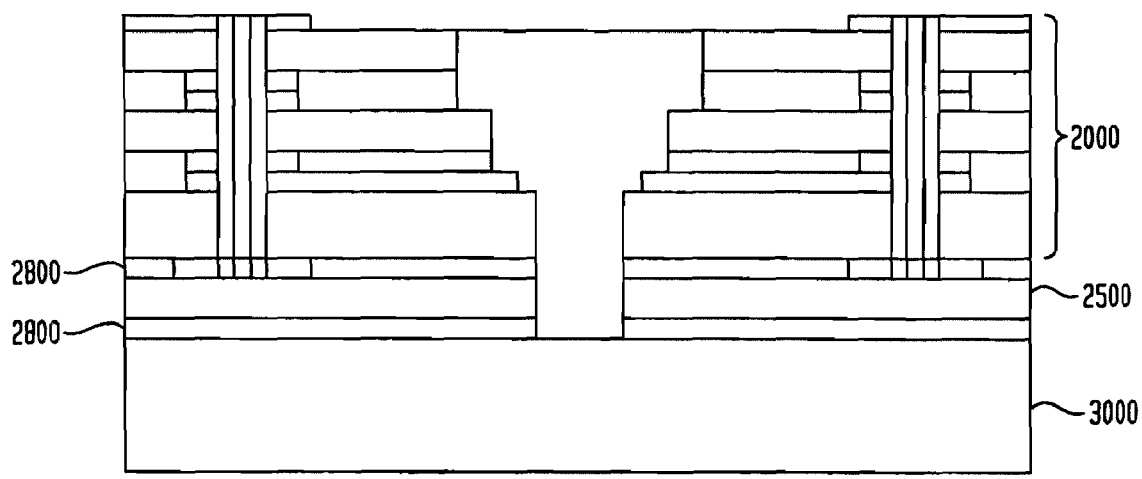

In step S2, the PWB assembly 2000, the insulating layer 2500, and the metal base 3000 are laminated together, as shown in FIG. 17B. According to an embodiment of the present invention, one or more laminate layers 2800 are disposed between the PWB assembly 2000 and the insulating layer 2500, and the insulating layer 2500 and the metal base 3000. The laminate layers 2800 include an aperture or opening which corresponds to the bottommost opening of the stepped cavity of the PWB assembly 2000 and the aperture of the insulating layer 2500, as shown in FIG. 17A. One having ordinary skill in the art will appreciate that the laminate layers 2800 may be composed of any suitable laminate material, including, but not limited to, a pressure sensitive adhesive, a pre-punched pre-preg material, or a combination of both.

Optionally, the top dielectric layer 1502A may be left in place until after the PWB assembly 2000 is laminated to the metal base 3000. By so doing, the PWB assembly 2000 is a more robust and stronger assembly, able to withstand process variations experienced during the lamination process. For example, leaving the top dielectric layer 1502A intact during integration of the PWB assembly 2000 into the LED package 5000 may result in less pre-punched pre-preg material running out onto the PWB layers and/or the metal base, and less deformation of the stepped cavity 1900 due to the stresses of the lamination process.

Figure 17C:
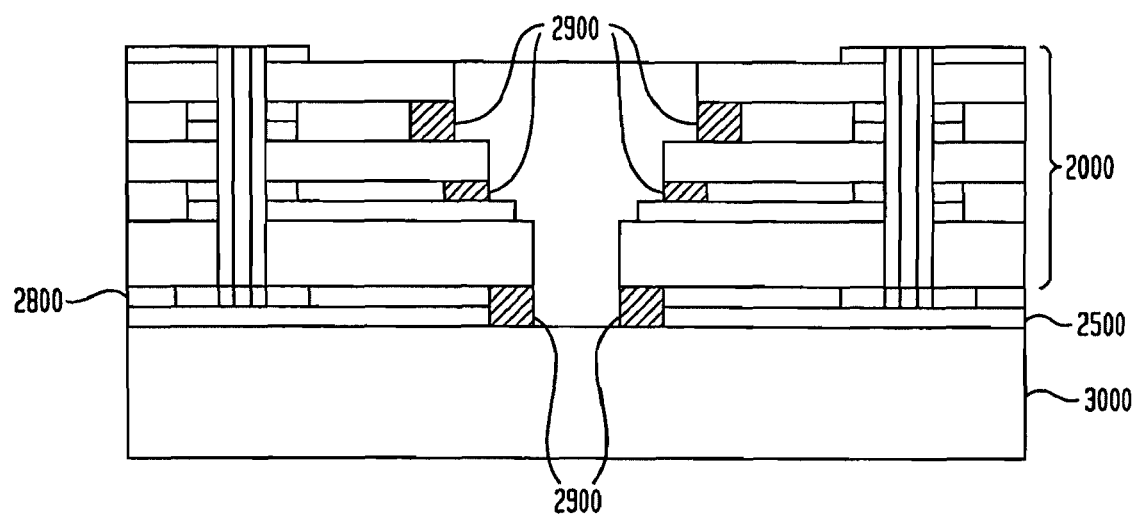

Optionally, according to an embodiment of the present invention, in step S3, in order to block the flow of the laminate material into the stepped cavity or onto one or more portions of an adjacent PWB layer, one or more dams may be applied to the laminate layers 2800. The dams 2900, shown in FIG. 17C, may be fabricated according to any suitable technique, including, but not limited to, a photo-imageable solder mask technique, a screen printed maskant technique, or by pre-scoring the laminate layers 2800 to include the one or more dams. The dams 2900 may be composed of any suitable material, such as, for example, DuPont Vacrel® 8100 Series Photopolymer Dry Film Solder Mask.

In step S4, one or more LED die 40 are introduced into the stepped cavity of the LED package 5000. As described in detail above, the one or more LED die 40 may be disposed directly on the metal base 3000, or, alternatively, the LED die 40 may be disposed on an interposer 3100, as shown in FIG. 17D. If the interposer 3100 is not included, one having ordinary skill in the art will appreciate that the metal base 3000 may be advantageously composed of CuMoCu, WCu, or other suitable TCE-matching material.

According to an embodiment of the present invention, the one or more LED die 40 may be electrically connected to a metal layer of the PWB assembly 2000 by any suitable means, including, but not limited to, wire bonds 3120.

Optionally, the LED package 5000 may include a reflector 3130 which reflects at least a portion of the light emitted by the one or more LED die 40. The reflector 3130 may be composed of any suitable reflective material, including, but not limited to, aluminum, polycarbonate, and liquid crystal polymer (LCP).

Optionally, the LED package 5000 may include an optical element 3140, such as a lens. The optical element 3140 may be composed of any suitable material, including but not limited to, glass, silicone and polycarbonate.

According to an embodiment of the present invention, the reflector 3130 and the optical element 3140 may be adapted to produce a desired radiation pattern, such as, for example, a focused, narrow light beam. The pattern forming reflector 3130 may be molded or machined plastic (metallized or unmetallized), molded or machined aluminum, other suitable reflective material, or a stamped metal part with a reflective surface. The reflector 3130 or reflective surface may be roughened to improve color mixing and avoid creating undesirable, non-uniform light output.

It is to be understood that the exemplary embodiments are merely illustrative of the present invention and that many variations of the above-described embodiments can be devised by one skilled in the art without departing from the scope of the invention. It is therefore intended that all such variations be included within the scope of the invention.

What is claimed is:

1. A LED package comprising:
    a metal base;
    a PWB assembly comprising first and second PWB layers, the first PWB layer having a first top metal layer, a first bottom metal layer, and a first dielectric layer disposed between the first top metal layer and the first bottom metal layer, and the second PWB layer having a second top metal layer, a second bottom metal layer, and a second dielectric layer disposed between the second top metal layer and the second bottom metal layer, the first and second PWB layers defining a plurality of stepped apertures, and the second dielectric layer having a thickness greater than a thickness of the first dielectric layer, wherein the PWB assembly overlies the metal base; one or more isolators disposed in at least one of the plurality of stepped apertures of the PWB assembly and mounted on the metal base; and
    one or more LED die mounted on at least one of the one or more isolators.

2. The LED package of claim 1, wherein the one or more isolators are composed of a material having a TCE approximately equal to the TCE of the one or more LED die.

3. The LED package of claim 1, further comprising an optical element disposed over the one or more LED die.

4. A LED package comprising:
    a metal base;
    a PWB assembly comprising first and second PWB layers, the first PWB layer having a first top metal layer, a first bottom metal layer, and a first dielectric layer disposed between the first top metal layer and the first bottom metal layer, and the second PWB layer having a second top metal layer, a second bottom metal layer, and a second dielectric layer disposed between the second top metal layer and the second bottom metal layer, the first and second PWB layers defining a plurality of stepped apertures, and the second dielectric layer having a thickness greater than a thickness of the first dielectric layer, wherein the PWB assembly overlies the metal base; and
    one or more LED die mounted on the metal base, wherein the metal base is composed of a material having a TCE approximately equal to the TCE of the one or more LED die.

5. A LED package comprising:
    a multi-layer assembly including a PWB assembly, an insulating layer, and a metal base laminated together by a laminate material, the PWB assembly and the insulating layer defining a stepped cavity;
    the PWB assembly having first and second PWB layers, the first PWB layer having a first top metal layer, a first bottom metal layer, and a first dielectric layer disposed between the first top metal layer and the first bottom metal layer, and the second PWB layer having a second top metal layer, a second bottom metal layer, and a second dielectric layer disposed between the second top metal layer and the second bottom metal layer, and the second dielectric layer having a thickness greater than a thickness of the first dielectric layer; and
    one or more LED die disposed in the stepped cavity.

6. The LED package of claim 5, wherein the PWB assembly comprises one or more vias.

7. The LED package of claim 6, wherein the one or more vias are electrically insulated from the metal base by the insulating layer.

8. The LED package of claim 5, wherein the laminate material comprises a pressure sensitive adhesive.

9. The LED package of claim 5, wherein the laminate material comprises a pre-preg material.

10. The LED package of claim 9, wherein the pre-preg material includes an aperture aligned with the stepped cavity.

11. The LED package of claim 5, wherein the one or more LED die are disposed on the metal base.

12. The LED package of claim 11, wherein the metal base is composed of a material having a TCE approximately equal to the TCE of the one or more LED die.

13. The LED package of claim 5 wherein the one or more LED die are mounted on an isolator disposed on the metal base.

14. The LED package of claim 13, wherein the isolator is composed of a material having a TCE approximately equal to the TCE of the one or more LED die.

15. The LED package of claim 5, wherein the insulating layer comprises a fiberglass reinforced material.

16. The LED package of claim 5, wherein the insulating layer comprises one or more layers of laminate material.

17. The LED package of claim 16, wherein the one or more layers of laminate material comprise a pre-punched pre-preg material.

18. The LED package of claim 17, wherein the one or more layers of laminate material comprise a pressure sensitive adhesive.

* * * * *